(12) United States Patent
Lin et al.

(10) Patent No.: US 9,947,625 B2
(45) Date of Patent: Apr. 17, 2018

(54) WIRING BOARD WITH EMBEDDED COMPONENT AND INTEGRATED STIFFENER AND METHOD OF MAKING THE SAME

(71) Applicant: BRIDGE SEMICONDUCTOR CORPORATION, Taipei (TW)

(72) Inventors: Charles W. C. Lin, Singapore (SG); Chia-Chung Wang, Hsinchu County (TW)

(73) Assignee: BRIDGE SEMICONDUCTOR CORPORATION, Taipei (TW)

( * ) Notice: Subject to any disclaimer, the term of this patent is extended or adjusted under 35 U.S.C. 154(b) by 0 days.

(21) Appl. No.: 15/283,305

(22) Filed: Oct. 1, 2016

(65) Prior Publication Data
US 2017/0018505 A1    Jan. 19, 2017

Related U.S. Application Data

(63) Continuation-in-part of application No. 14/746,792, filed on Jun. 22, 2015.
(Continued)

(51) Int. Cl.
*H01L 23/495*    (2006.01)
*H01L 23/538*    (2006.01)
(Continued)

(52) U.S. Cl.
CPC ........ *H01L 23/5389* (2013.01); *H01L 21/486* (2013.01); *H01L 21/52* (2013.01);
(Continued)

(58) Field of Classification Search
CPC ............. H01L 23/4334; H01L 23/5389; H01L 21/486; H01L 21/52; H01L 21/6835; H01L 21/3121
(Continued)

(56) References Cited

U.S. PATENT DOCUMENTS 6,570,248 B1 * 5/2003 Ahn ................. H01L 23/49827
257/723
7,851,269 B2    12/2010 Muthukumar et al.
(Continued)

*Primary Examiner* — Steven T Sawyer
(74) *Attorney, Agent, or Firm* — Pai Patent & Trademark Law Firm; Chao-Chang David Pai

(57) ABSTRACT

A wiring board with embedded component and integrated stiffener is characterized in that an embedded semiconductor device, a first routing circuitry, an encapsulant and an array of vertical connecting elements are integrated as an electronic component disposed within a through opening of a stiffener, and a second routing circuitry is disposed beyond the through opening of the stiffener and extends over the stiffener. The mechanical robustness of the stiffener can prevent the wiring board from warping. The embedded semiconductor device is electrically coupled to the first routing circuitry and surrounded by the vertical connecting elements in electrical connection with the first and second routing circuitries. The first routing circuitry provides primary fan-out routing for another semiconductor device to be assembled on the wiring board, whereas the second routing circuitry not only provides further fan-out wiring structure, but also mechanically binds the electronic component with the stiffener.

13 Claims, 24 Drawing Sheets

Related U.S. Application Data

(60) Provisional application No. 62/092,196, filed on Dec. 15, 2014, provisional application No. 62/121,450, filed on Feb. 26, 2015.

(51) Int. Cl.

| | | |
|---|---|---|
| *H01L 23/31* | (2006.01) | |
| *H01L 25/065* | (2006.01) | |
| *H01L 21/683* | (2006.01) | |
| *H01L 21/56* | (2006.01) | |
| *H01L 23/00* | (2006.01) | |
| *H01L 21/52* | (2006.01) | |
| *H05K 1/18* | (2006.01) | |
| *H01L 23/367* | (2006.01) | |
| *H01L 23/433* | (2006.01) | |
| *H01L 21/48* | (2006.01) | |
| *H01L 23/498* | (2006.01) | |
| *H05K 3/46* | (2006.01) | |

(52) U.S. Cl.
CPC .......... *H01L 21/56* (2013.01); *H01L 21/6835* (2013.01); *H01L 23/3121* (2013.01); *H01L 23/3677* (2013.01); *H01L 23/4334* (2013.01); *H01L 23/49822* (2013.01); *H01L 23/49827* (2013.01); *H01L 23/5384* (2013.01); *H01L 23/5385* (2013.01); *H01L 23/5386* (2013.01); *H01L 23/562* (2013.01); *H01L 25/065* (2013.01); *H01L 25/0657* (2013.01); *H05K 1/181* (2013.01); *H05K 3/4694* (2013.01); *H01L 23/49816* (2013.01); *H01L 2221/68359* (2013.01); *H01L 2224/16225* (2013.01); *H01L 2224/73204* (2013.01); *H01L 2225/06517* (2013.01); *H01L 2225/06548* (2013.01); *H01L 2225/06589* (2013.01); *H05K 1/183* (2013.01); *H05K 3/4682* (2013.01); *Y02P 70/611* (2015.11)

(58) Field of Classification Search
USPC .................................. 438/123; 257/667, 778
See application file for complete search history.

(56) References Cited

U.S. PATENT DOCUMENTS

| | | | |
|---|---|---|---|
| 7,902,660 | B1 | 3/2011 | Lee et al. |
| 7,981,728 | B2 | 7/2011 | Cho |
| 8,227,703 | B2 | 7/2012 | Maruyama et al. |
| 8,453,323 | B2 | 6/2013 | Sakamoto et al. |
| 8,501,544 | B2 | 8/2013 | Pagaila |
| 8,525,337 | B2 | 9/2013 | Pendse |
| 8,536,715 | B2 | 9/2013 | Chino |
| 8,618,652 | B2 | 12/2013 | Nalla et al. |
| 8,836,114 | B2 | 9/2014 | Oh et al. |
| 8,952,526 | B2 | 2/2015 | Lin et al. |
| 2006/0043568 | A1* | 3/2006 | Abe .................... H01L 21/4857 257/698 |
| 2008/0308950 | A1* | 12/2008 | Yoo ........................ H01L 25/16 257/778 |
| 2010/0025081 | A1 | 2/2010 | Arai et al. |
| 2011/0049695 | A1* | 3/2011 | Shin ...................... H01L 21/561 257/686 |
| 2011/0291249 | A1* | 12/2011 | Chi ...................... H01L 21/4832 257/675 |
| 2012/0056329 | A1 | 3/2012 | Pagaila et al. |
| 2013/0271929 | A1 | 10/2013 | Malatkar et al. |
| 2015/0084206 | A1* | 3/2015 | Lin ..................... H01L 23/5389 257/774 |

\* cited by examiner

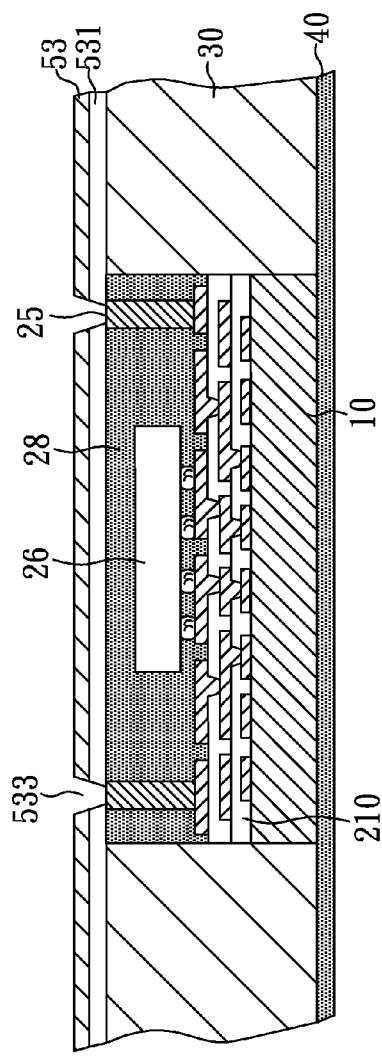
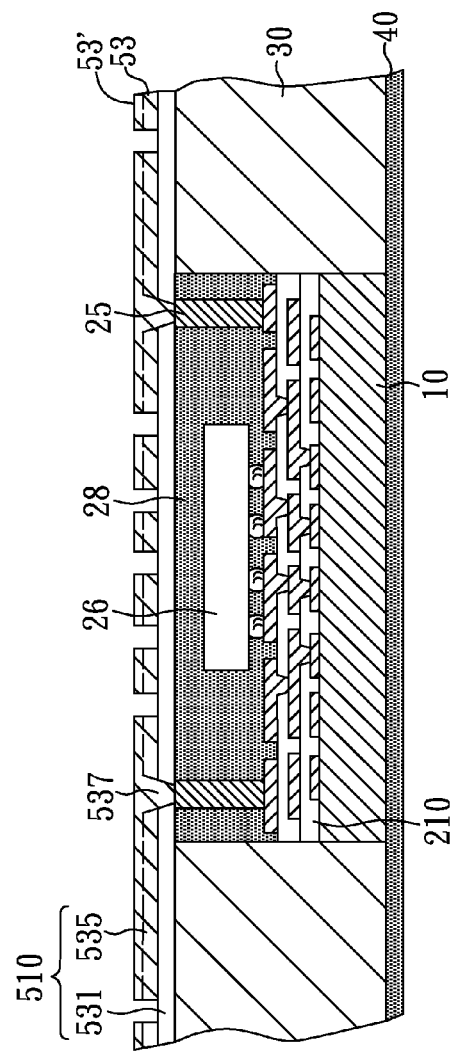
FIG. 16
FIG. 17

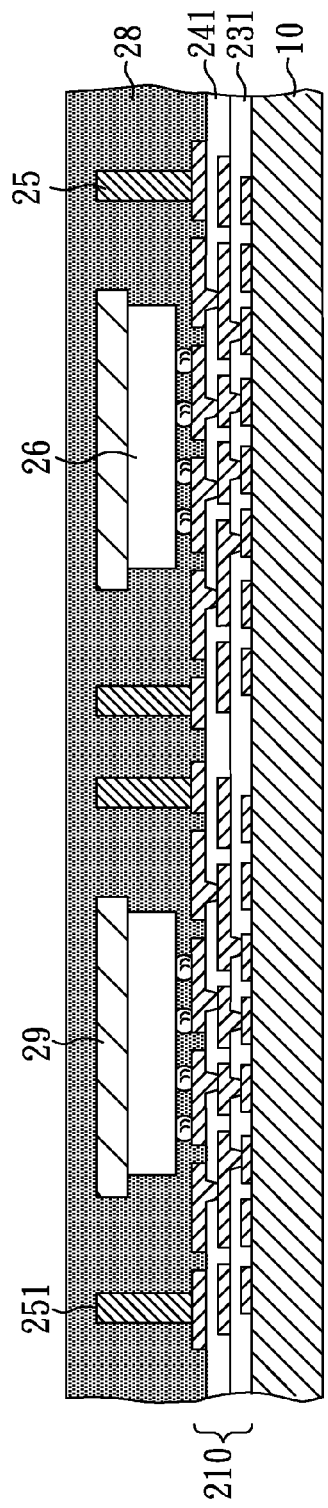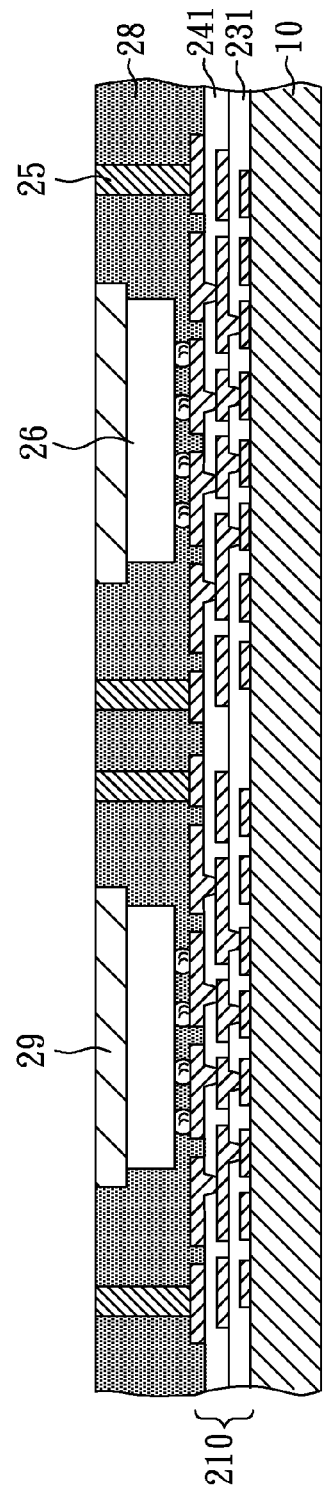

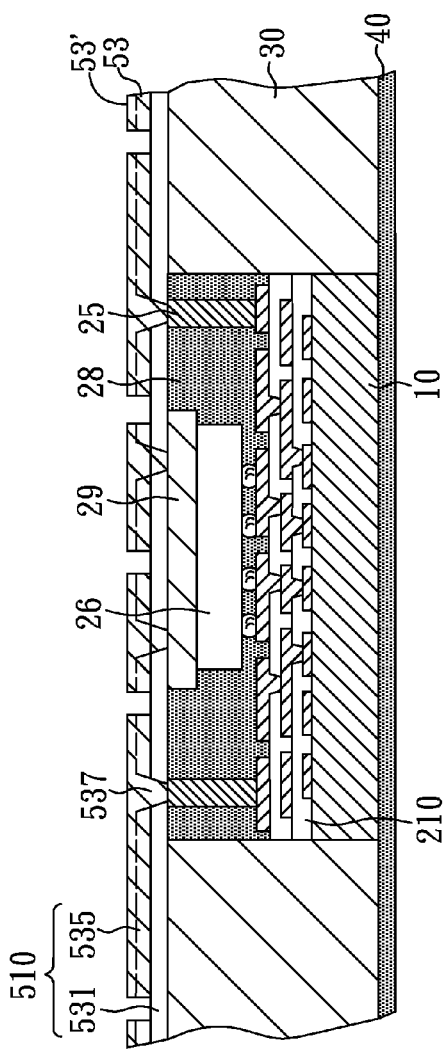
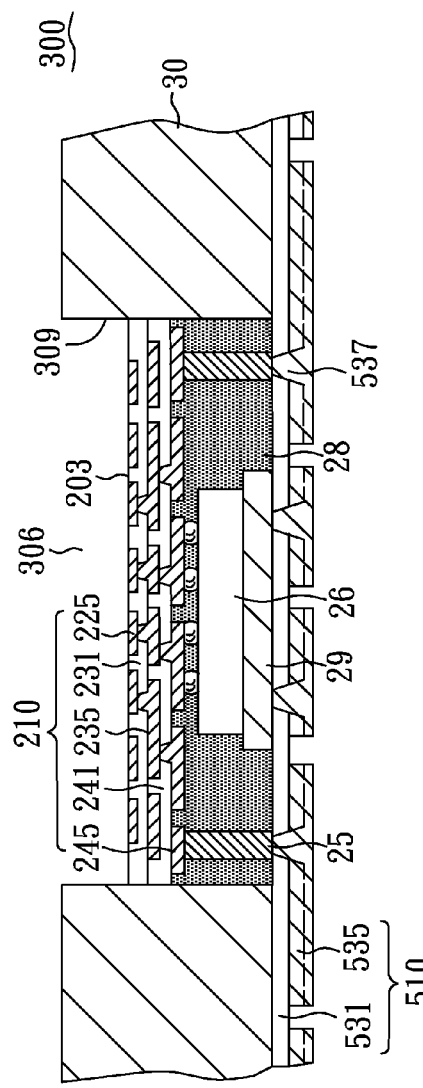
FIG. 39
FIG. 40

WIRING BOARD WITH EMBEDDED COMPONENT AND INTEGRATED STIFFENER AND METHOD OF MAKING THE SAME

CROSS REFERENCE TO RELATED APPLICATIONS

This application is a continuation-in-part of U.S. application Ser. No. 14/746,792 filed Jun. 22, 2015, which claims the priority benefit of U.S. Provisional Application Ser. No. 62/092,196 filed Dec. 15, 2014 and the priority benefit of U.S. Provisional Application Ser. No. 62/121,450 filed Feb. 26, 2015. The entirety of each of said applications is incorporated herein by reference.

FIELD OF THE INVENTION

The present invention relates to a wiring board and, more particularly, to a wiring board having an embedded component and an integrated stiffener, and a method of making the same.

DESCRIPTION OF RELATED ART

Market trends of multimedia devices demand for faster and slimmer designs. One of the approaches is to embed an electronic device in a wiring board so that the electrical performance of the board can be improved and/or another device(s) can be assembled on the board to form a 3D stacking structure. U.S. Pat. Nos. 8,453,323, 8,525,337, 8,618,652 and 8,836,114 disclose various wiring boards having an embedded device for such purposes. However, in addition to poor warping control, other features such as design flexibility are not addressed. Additionally, it is extremely difficult to embed an electronic device in a wiring board without suffering high yield loss. This is because minor dislocation of the embedded device due to placement accuracy or adhesive curing dislocation may lead to I/O disconnection, device failure and low manufacturing yield as described in U.S. Pat. Nos. 8,536,715 and 8,501,544.

For the reasons stated above, and for other reasons stated below, an urgent need exists to develop a new wiring board having embedded device that can address routing requirement and ensure ultra-high packaging density, high signal integrity, low profile and low warpage.

SUMMARY OF THE INVENTION

A primary objective of the present invention is to provide a wiring board with a first routing circuitry, an embedded semiconductor device and an encaspulant positioned within a through opening of a stiffener so that the dislocation, central area warping and bending of the wiring board can be suppressed, thereby improving production yield and device-level reliability.

Another objective of the present invention is to provide a wiring board in which a second routing circuitry extends into an area outside of the through opening of the stiffener and is electrically connected to the first routing circuitry through an array of vertical connecting elements in the encapsulant, so that the outmost area warping and bending of the wiring board is well controlled and high routing flexibility can be achieved by the first and second routing circuitries. For instance, the first routing circuitry can be configured as primary fan-out circuitry with very high routing density and the second routing circuitry can be configured as further fan-out circuitry with much coarser line/space for next-level board assembling.

In accordance with the foregoing and other objectives, the present invention provides a wiring board that includes a stiffener, a first routing circuitry, a first semiconductor device, an encapsulant, an array of vertical connecting elements, and a second routing circuitry. The first routing circuitry, the first semiconductor device, the encapsulant and the vertical connecting elements are integrated as an electronic component surrounded by the stiffener. In a preferred embodiment, the stiffener, having a through opening, provides a high modulus anti-warping platform for the wiring board; the first semiconductor device, flip-chip mounted on the first routing circuitry, is sealed in the encapsulant and surrounded by the vertical connecting elements; the first routing circuitry, adjacent to one side of the encapsulant, provides primary fan-out routing for a second semiconductor device to be assembled thereon and offers the shortest routing distance between the first and second semiconductor devices; the second routing circuitry, adjacent to the other side of the encapsulant and laterally extending on the stiffener, mechanically binds the electronic component with the stiffener and provides secondary fan-out routing and has pad pith and size that match the next level assembly; and the vertical connecting elements, positioned between the first and second routing circuitries, extends through the encapsulant and offers electrical connection between the first routing circuitry and the second routing circuitry.

In another aspect, the present invention provides a wiring board, comprising: a stiffener having a through opening, wherein the through opening has an interior sidewall surface that extends through the stiffener; an electronic component that is positioned within the through opening of the stiffener and adjacent to the interior sidewall surface of the stiffener and includes a first semiconductor device, an encapsulant, an array of vertical connecting elements and a first routing circuitry disposed on a first surface of the encapsulant, wherein (i) the first semiconductor device is embedded in the encapsulant and electrically coupled to the first routing circuitry and (ii) the vertical connecting elements are laterally covered by the encapsulant and surround the first semiconductor device, wherein the vertical connecting elements are electrically coupled to the first routing circuitry and extend to a second surface of the encapsulant opposite to the first surface; and a second routing circuitry that is disposed over the second surface of the encapsulant and laterally extending over a surface of the stiffener, wherein the second routing circuitry is electrically coupled to the vertical connecting elements in the encapsulant. Further, the present invention also provides a face-to-face semiconductor assembly that includes the aforementioned wiring board and a second semiconductor device disposed in the through opening of the stiffener and face-to-face electrically coupled to the first semiconductor device through the first routing circuitry therebetween.

In yet another aspect, the present invention provides a method of making, comprising steps of: providing an electronic component over a sacrificial carrier, the electronic component including a semiconductor device, an encapsulant, an array of vertical connecting elements and a first routing circuitry disposed on a first surface of the encapsulant, wherein (i) the first routing circuitry detachably is adhered over the sacrificial carrier, (ii) the semiconductor device is embedded in the encapsulant and electrically coupled to the first routing circuitry, and (ii) the vertical connecting elements surround the semiconductor device and are electrically coupled to the first routing circuitry; providing a stiffener that has a through opening, wherein the through opening has an interior sidewall surface that extends through the stiffener; inserting the electronic component and the sacrificial carrier into the through opening of the stiffener, with the electronic component and the sacrificial carrier being adjacent to the interior edge surface of the stiffener; forming a second routing circuitry that is disposed over a second surface of the encapsulant opposite to the first surface and a surface of the stiffener, wherein the second routing circuitry is electrically coupled to the vertical connecting elements in the encapsulant; and removing the sacrificial carrier from the first routing circuitry.

Unless specifically indicated or using the term "then" between steps, or steps necessarily occurring in a certain order, the sequence of the above-mentioned steps is not limited to that set forth above and may be changed or reordered according to desired design.

The method of making a wiring board according to the present invention has numerous advantages. For instance, inserting the sacrificial carrier and the electronic component into the through opening of the stiffener before the formation of the second routing circuitry is particularly advantageous as the sacrificial carrier together with the stiffener provides a stable platform for forming the second routing circuitry. Forming the encapsulant on the first routing circuitry can provides another high modulus anti-warping platform for the wiring board, so that the warping after removal of the sacrificial carrier can be suppressed by the mechanical robustness of the encapsulant and the stiffener. Additionally, the two-stage formation of the interconnect substrate can avoid serious warping problem when multiple layers of routing circuitries are needed.

These and other features and advantages of the present invention will be further described and more readily apparent from the detailed description of the preferred embodiments which follows.

BRIEF DESCRIPTION OF THE DRAWINGS

The following detailed description of the preferred embodiments of the present invention can best be understood when read in conjunction with the following drawings, in which:

FIG. 16 is a cross-sectional view of the structure of FIG. 15 further provided with third via openings in accordance with the first embodiment of the present invention;

FIG. 17 is a cross-sectional view of the structure of FIG. 16 further provided with third conductive traces in accordance with the first embodiment of the present invention;

FIG. 33 is a cross-sectional view of the structure of FIG. 32 further provided with an encapsulant in accordance with the third embodiment of the present invention;

FIG. 34 is a cross-sectional view of the structure of FIG. 33 after removal of a top portion of the encapsulant in accordance with the third embodiment of the present invention;

FIG. 39 is a cross-sectional view of the structure of FIG. 38 further provided with third conductive traces in accordance with the third embodiment of the present invention;

FIG. 40 is a cross-sectional view of the structure of FIG. 39 after removal of the carrier film and the sacrificial carrier to finish the fabrication of a wiring board in accordance with the third embodiment of the present invention;

DETAILED DESCRIPTION OF THE PREFERRED EMBODIMENTS

Hereafter, examples will be provided to illustrate the embodiments of the present invention. Advantages and effects of the invention will become more apparent from the disclosure of the present invention. It should be noted that these accompanying figures are simplified and illustrative. The quantity, shape and size of components shown in the figures may be modified according to practical conditions, and the arrangement of components may be more complex. Other various aspects also may be practiced or applied in the invention, and various modifications and variations can be made without departing from the spirit of the invention based on various concepts and applications.

[Embodiment 1]

FIGS. 1-18 are schematic views showing a method of making a wiring board that includes a stiffener, a first routing circuitry, a first semiconductor device, an array of vertical connecting elements, an encapsulant and a second routing circuitry in accordance with the first embodiment of the present invention.

Figure 1:
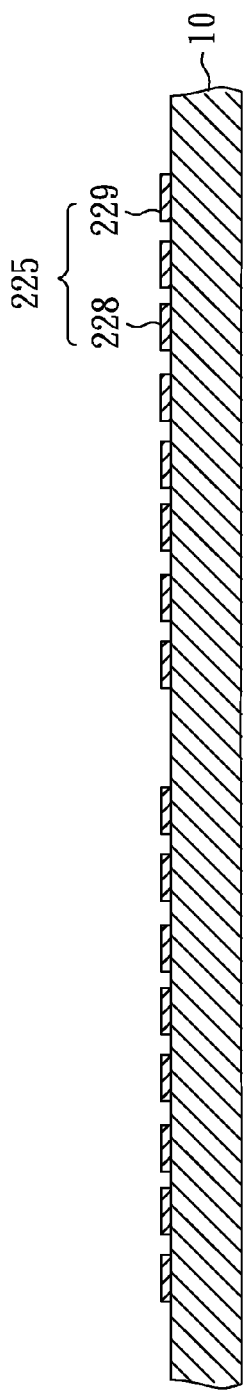
FIGS. 1 and 2 are cross-sectional and top perspective views, respectively, of the structure with routing traces formed on a sacrificial carrier in accordance with the first embodiment of the present invention.
Figure 2:
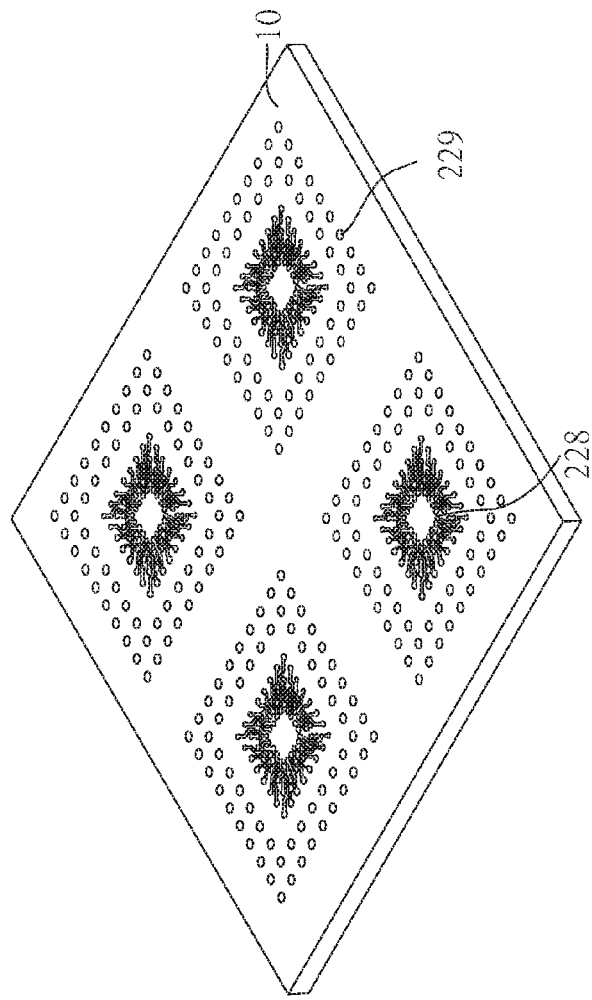

FIGS. 1 and 2 are cross-sectional and top perspective views, respectively, of the structure with routing traces 225 formed on a sacrificial carrier 10 by metal deposition and metal patterning process. In this illustration, the sacrificial carrier 10 is a single-layer structure, and the routing traces 225 include bond pads 228 and stacking pads 229. The sacrificial carrier 10 typically is made of copper, aluminum, iron, nickel, tin, stainless steel, silicon, or other metals or alloys, but any other conductive or non-conductive material also may be used. The thickness of the sacrificial carrier 10 preferably ranges from 0.1 to 2.0 mm. In this embodiment, the sacrificial carrier 10 is made of an iron-based material and has a thickness of 1.0 mm. The routing traces 225 typically are made of copper and can be pattern deposited by numerous techniques, such as electroplating, electroless plating, evaporating, sputtering or their combinations, or be thin-film deposited followed by a metal patterning process. For a conductive sacrificial carrier 10, the routing traces 225 are deposited typically by plating of metal. The metal patterning techniques include wet etching, electro-chemical etching, laser-assist etching, and their combinations with an etch mask (not shown) thereon that defines the routing traces 225.

Figure 3:
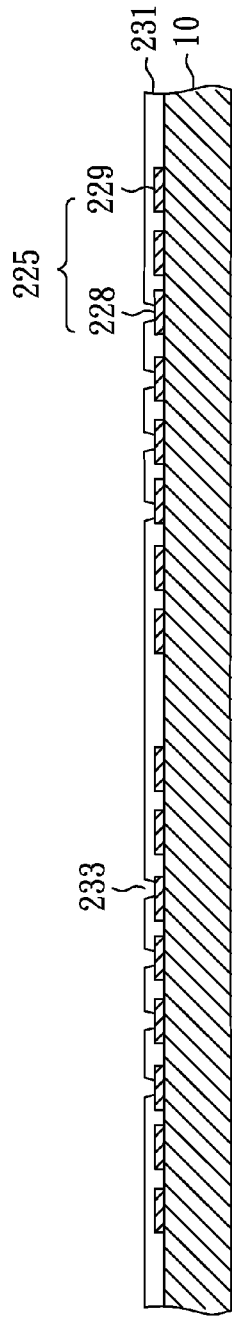
FIG. 3 is a cross-sectional view of the structure of FIG. 1 further provided with a first dielectric layer and first via openings in accordance with the first embodiment of the present invention.

FIG. 3 is a cross-sectional view of the structure with a first dielectric layer 231 on the sacrificial carrier 10 as well as the routing traces 225 and first via openings 233 in the first dielectric layer 231. The first dielectric layer 231 is deposited typically by lamination or coating, and contacts and covers and extends laterally on the sacrificial carrier 10 and the routing traces 225 from above. The first dielectric layer 231 typically has a thickness of 50 microns, and can be made of epoxy resin, glass-epoxy, polyimide, or the like. After the deposition of the first dielectric layer 231, the first via openings 233 are formed by numerous techniques including laser drilling, plasma etching and photolithography, and typically have a diameter of 50 microns. Laser drilling can be enhanced by a pulsed laser. Alternatively, a scanning laser beam with a metal mask can be used. The first via openings 233 extend through the first dielectric layer 231 and are aligned with selected portions of the routing traces 225.

Figure 4:
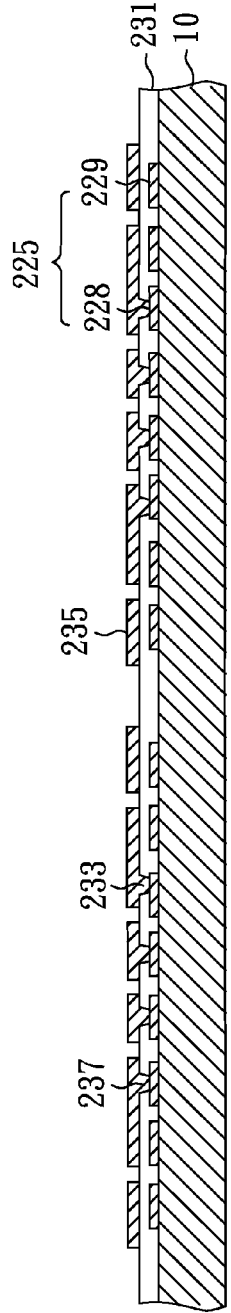
FIG. 4 is a cross-sectional view of the structure of FIG. 3 further provided with first conductive traces in accordance with the first embodiment of the present invention.

Referring now to FIG. 4, first conductive traces 235 are formed on the first dielectric layer 231 by metal deposition and metal patterning process. The first conductive traces 235 extend from the routing traces 225 in the upward direction, fill up the first via openings 233 to form first metallized vias 237 in direct contact with the routing traces 225, and extend laterally on the first dielectric layer 231. As a result, the first conductive traces 235 can provide horizontal signal routing in both the X and Y directions and vertical routing through the first via openings 233 and serve as electrical connections for the routing traces 225.

The first conductive traces 235 can be deposited as a single layer or multiple layers by any of numerous techniques, such as electroplating, electroless plating, evaporating, sputtering, or their combinations. For instance, they can be deposited by first dipping the structure in an activator solution to render the first dielectric layer 231 catalytic to electroless copper, and then a thin copper layer is electrolessly plated to serve as the seeding layer before a second copper layer is electroplated on the seeding layer to a desirable thickness. Alternatively, the seeding layer can be formed by sputtering a thin film such as titanium/copper before depositing the electroplated copper layer on the seeding layer. Once the desired thickness is achieved, the plated layer can be patterned to form the first conductive traces 235 by any of numerous techniques including wet etching, electro-chemical etching, laser-assist etching, and their combinations, with an etch mask (not shown) thereon that defines the first conductive traces 235.

Figure 5:
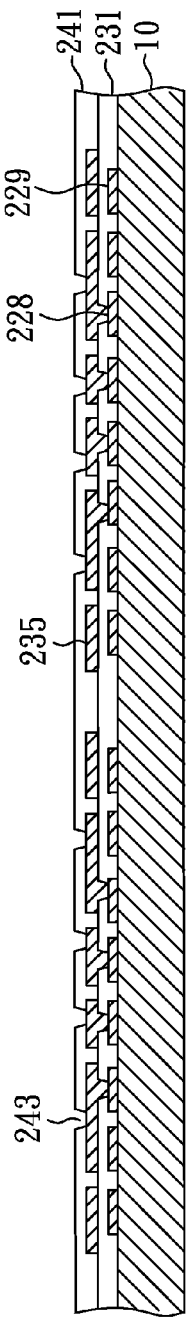
FIG. 5 is a cross-sectional view of the structure of FIG. 4 further provided with a second dielectric layer and second via openings in accordance with the first embodiment of the present invention.

FIG. 5 is a cross-sectional view of the structure with a second dielectric layer 241 on the first dielectric layer 231 as well as the first conductive traces 235 and second via openings 243 in the second dielectric layer 241. The second dielectric layer 241 is deposited typically by lamination or coating, and contacts and covers and extends laterally on the first dielectric layer 231 and the first conductive traces 235 from above. The second dielectric layer 241 typically has a thickness of 50 microns, and can be made of epoxy resin, glass-epoxy, polyimide, or the like. After the deposition of the second dielectric layer 241, the second via openings 243 are formed and extend through the second dielectric layer 241 to expose selected portions of the first conductive traces 235. Like the first via openings 233, the second via openings 243 can be formed by any of numerous techniques including laser drilling, plasma etching and photolithography and typically have a diameter of 50 microns.

Figure 6:
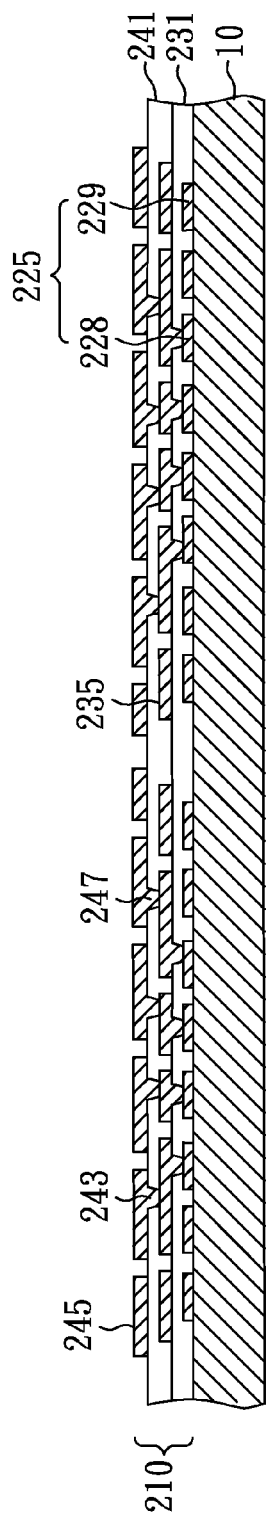
FIG. 6 is a cross-sectional view of the structure of FIG. 5 further provided with second conductive traces in accordance with the first embodiment of the present invention.

FIG. 6 is a cross-sectional view of the structure provided with second conductive traces 245 on the second dielectric layer 241 by metal deposition and metal patterning process. The second conductive traces 245 extend from the first conductive traces 235 in the upward direction, fill up the second via openings 243 to form second metallized vias 247 in direct contact with the first conductive traces 235, and extend laterally on the second dielectric layer 241.

At this stage, the formation of a first routing circuitry 210 on the sacrificial carrier 10 is accomplished. In this illustration, the first routing circuitry 210 includes routing traces 225, a first dielectric layer 231, first conductive traces 235, a second dielectric layer 241 and the second conductive traces 245.

Figure 7:
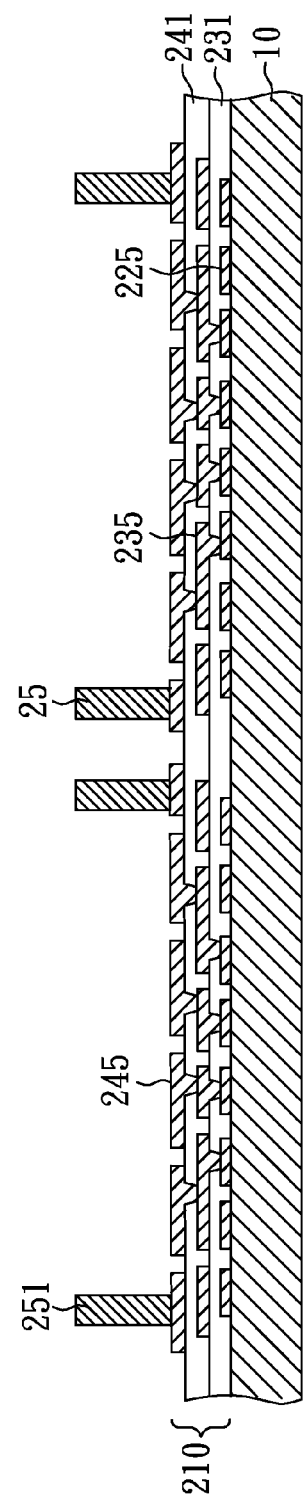
FIG. 7 is a cross-sectional view of the structure of FIG. 6 further provided with metal pillars in accordance with the first embodiment of the present invention.

FIG. 7 is a cross-sectional view of the structure with an array of vertical connecting elements 25 on the first routing circuitry 210. In this illustration, the vertical connecting elements 25 are illustrated as metal pillars 251 and electrically connected to and contact the second conductive traces 245 of the first routing circuitry 210.

Figure 8:
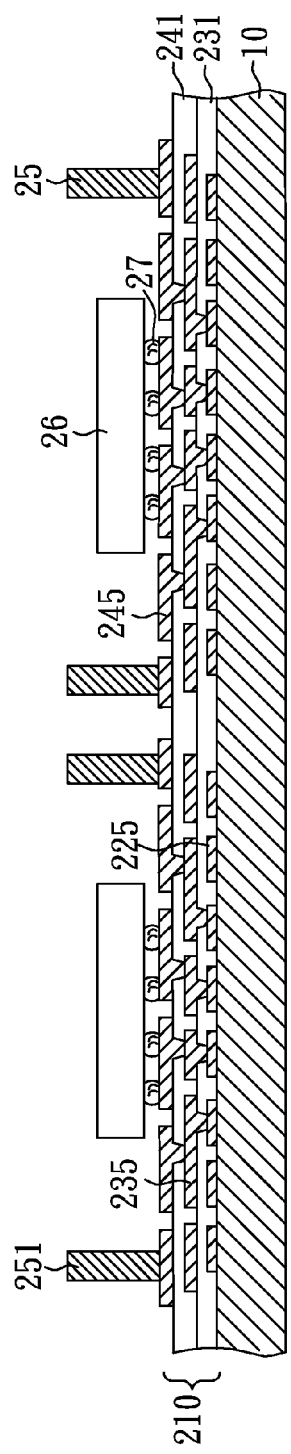
FIG. 8 is a cross-sectional view of the structure of FIG. 7 further provided with first semiconductor devices in accordance with the first embodiment of the present invention.

FIG. 8 is a cross-sectional view of the structure with first semiconductor devices 26 electrically coupled to the first routing circuitry 210. The first semiconductor devices 26, illustrated as bare chips, can be electrically coupled to the second conductive traces 245 of the first routing circuitry 210 using bumps 27 by thermal compression, solder reflow or thermosonic bonding.

Figure 9:
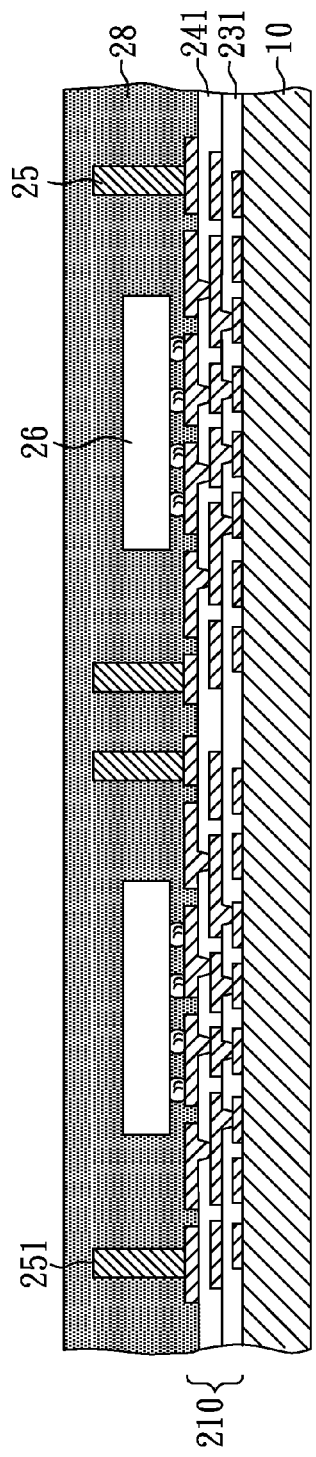
FIG. 9 is a cross-sectional view of the structure of FIG. 8 further provided with an encapsulant in accordance with the first embodiment of the present invention.

FIG. 9 is a cross-sectional view of the structure with an encapsulant 28 on the vertical connecting elements 25, the first semiconductor devices 26 and the first routing circuitry 210 by, for example, resin-glass lamination, resin-glass coating or molding. The encapsulant 28 covers the vertical connecting elements 25, the first semiconductor devices 26 and the first routing circuitry 210 from above and surrounds and conformally coats and covers sidewalls of the vertical connecting elements 25 and the first semiconductor devices 26.

Figure 10:
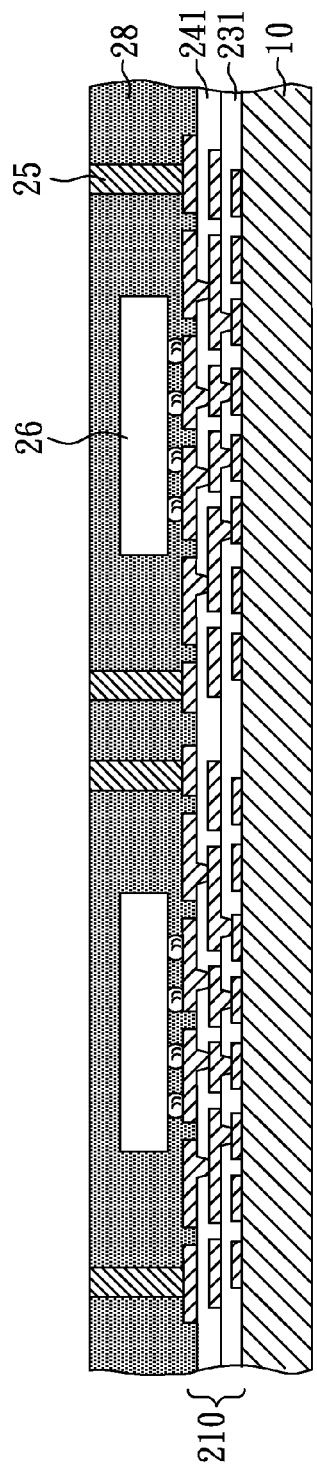
FIG. 10 is a cross-sectional view of the structure of FIG. 9 after removal of a top portion of the encapsulant in accordance with the first embodiment of the present invention.

FIG. 10 is a cross-sectional view of the structure with the vertical connecting elements 25 exposed from above. The upper portion of the encapsulant 28 can be removed by grinding. In this illustration, the vertical connecting elements 25 has an exposed surface substantially coplanar with an exterior surface of the encapsulant 28 from above.

Figure 11:
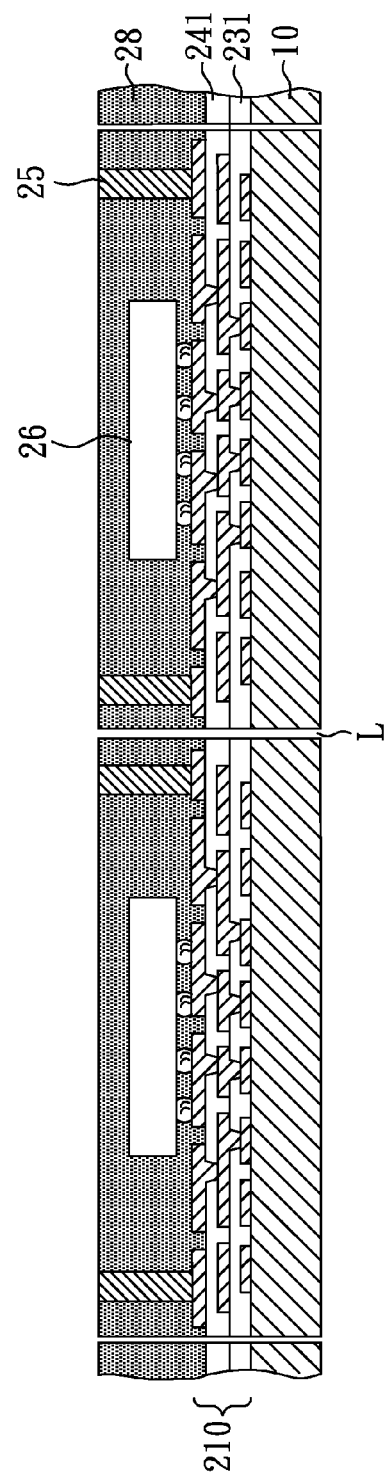
FIG. 11 is a cross-sectional view of a diced state of the panel-scale structure of FIG. 10 in accordance with the first embodiment of the present invention.

FIG. 11 is a cross-sectional view of the panel-scale structure of FIG. 10 diced into individual pieces. In this illustration, the panel-scale structure is singulated into individual pieces along dicing lines "L".

Figure 12:
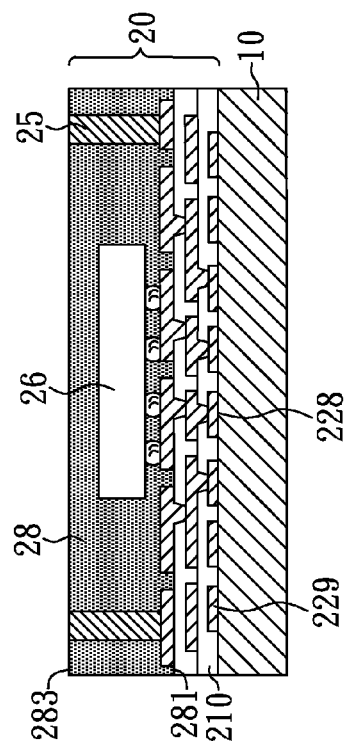
FIG. 12 is a cross-sectional view of the structure corresponding to a diced unit in FIG. 11 in accordance with the first embodiment of the present invention.

FIG. 12 is a cross-sectional view of an individual piece that includes a sacrificial carrier 10 and an electronic component 20 on the sacrificial carrier 10. The electronic component 20 includes a first routing circuitry 210, an array of vertical connecting elements 25, a first semiconductor device 26 and an encapsulant 28. In this illustration, the first routing circuitry 210 is a buildup routing circuitry that is detachably adhered on the sacrificial carrier 10 and adjacent to the first surface 281 of the encapsulant 28. The first routing circuitry 210 includes bond pads 228 and stacking pads 229 in contact with the sacrificial carrier 10. The bond pads 228 are to match chip I/O pads and have a pitch smaller than that of second conductive traces adjacent to the encapsulant 28. Accordingly, the first routing circuitry 210 has a pattern of traces that fan out from a finer pitch at bonds pads 228 adjacent to the sacrificial carrier 10 to a coarser pitch at the second conductive traces adjacent to the encapsulant 28. The first semiconductor device 26 is embedded in the encapsulant 28 and electrically coupled to the first routing circuitry 210. The vertical connecting elements 25 are sealed in the encapsulant 28 and surround the first semiconductor device 26 and extend from the first routing circuitry 210 to the second surface 283 of the encapsulant 28.

Figure 13:
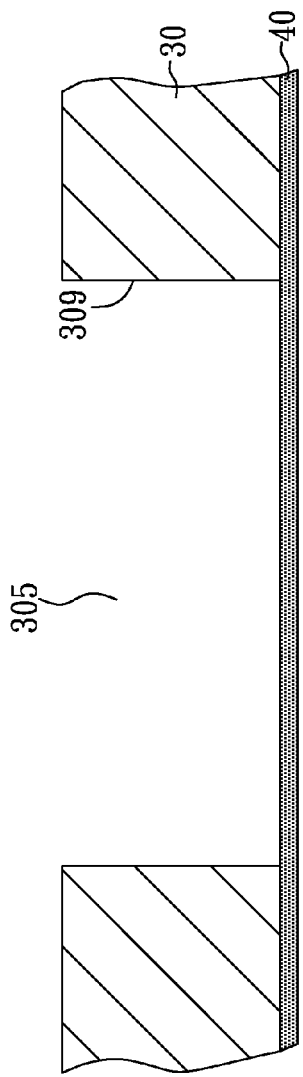
FIG. 13 is a cross-sectional view of a stiffener on a carrier film in accordance with the first embodiment of the present invention.

FIG. 13 is a cross-sectional view of a stiffener 30 on a carrier film 40. The stiffener 30 can be made of ceramic, metal, resin, composites of metal, or a single or multi-layer circuitry structure which has enough mechanical robustness. The stiffener 30 preferably has a thickness substantially the same as the combined thickness of the sacrificial carrier 10 and the electronic component 20 and a through openings 305 that can be formed by laser cutting, punching or mechanical drilling. The through openings 305 has an interior sidewall surface 309 that extends through the stiffener 30, and preferably has a dimension that is substantially the same or slightly larger than the sacrificial carrier 10 and the electronic component 20. The carrier film 40 typically is a tape, and the stiffener 30 is attached to the carrier film 40 by the adhesive property of the carrier film 40.

Figure 14:
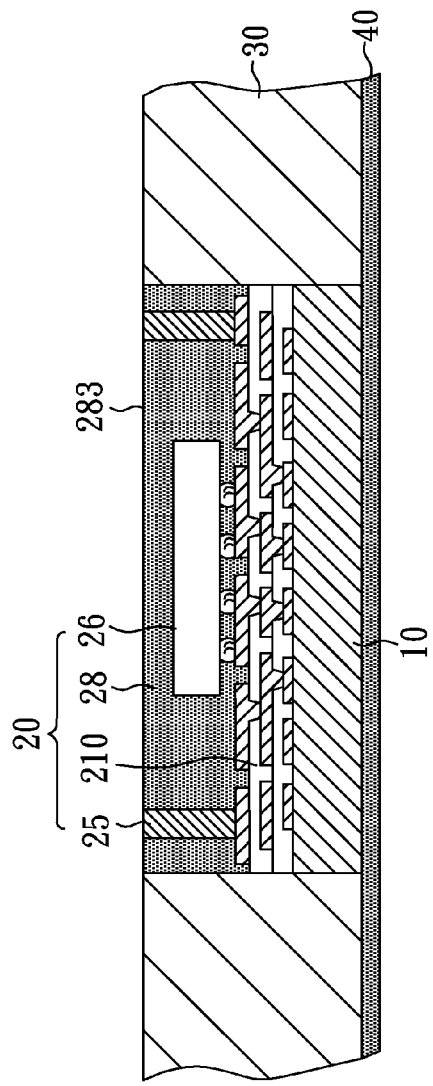
FIG. 14 is a cross-sectional view of the structure of FIG. 12 further attached to the carrier film of FIG. 13 in accordance with the first embodiment of the present invention.

FIG. 14 is a cross-sectional view of the structure with the sacrificial carrier 10 and the electronic component 20 inserted in the through opening 305 of the stiffener 30 with the sacrificial carrier 10 attached on the carrier film 40. The sacrificial carrier 10 and the electronic component 20 are adjacent to the interior sidewall surface 309 of the stiffener 30. The carrier film 40 can provide temporary retention force for the sacrificial carrier 10 and the electronic component 20 steadily residing within the through opening 305. In this illustration, the sacrificial carrier 10 is attached to the carrier film 40 by the adhesive property of the carrier film 40.

Alternatively, the sacrificial carrier 10 may be attached to the carrier film 40 by dispensing extra adhesive. After the insertion of the sacrificial carrier 10 and the electronic component 20 into the through opening 305, the second surface 283 of the encapsulant 28 is substantially coplanar with the exterior surface of the stiffener 30 in the upward direction. In the case of the through opening 305 having a slightly larger area than the sacrificial carrier 10 and the electronic component 20 an adhesive (not shown in the figure) may be optionally dispensed in a gap (not shown in the figure) located in the through opening 305 between the sacrificial carrier 10 and the stiffener 30 and between the electronic component 20 and the stiffener 30 to provide secure robust mechanical bonds between the electronic component 20 and the stiffener 30.

Figure 15:
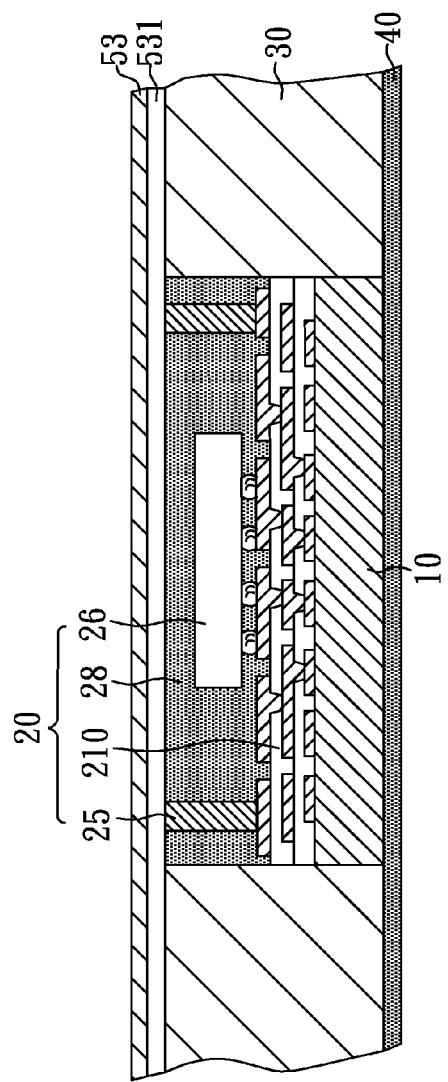
FIG. 15 is a cross-sectional view of the structure of FIG. 14 further provided with a third dielectric layer and a metal layer in accordance with the first embodiment of the present invention.

FIG. 15 is a cross-sectional view of the structure with a third dielectric layer 531 and a metal layer 53 laminated/coated on the electronic component 20 and the stiffener 30 from above. The third dielectric layer 531 contacts and is sandwiched between the vertical connecting elements 25/the encapsulant 28 and the metal layer 53 and between the stiffener 30 and the metal layer 53. The third dielectric layer 531 can be formed of epoxy resin, glass-epoxy, polyimide and the like, and typically has a thickness of 50 microns. The metal layer 53 typically is a copper layer with a thickness of 25 microns.

FIG. 16 is a cross-sectional view of the structure provided with the third via openings 533 to expose the vertical connecting elements 25 from above. The third via openings 533 extend through the metal layer 53 and the third dielectric layer 531, and are aligned with selected portions of the vertical connecting elements 25. Like the first and second via openings 233, 243, the third via openings 533 can be formed by any of numerous techniques including laser drilling, plasma etching and photolithography and typically have a diameter of 50 microns.

Referring now to FIG. 17, third conductive traces 535 are formed on the third dielectric layer 531 by depositing a plated layer 53' on the metal layer 53 and into the third via openings 533 and then patterning the metal layer 53 as well as the plated layers 53' thereon. The third conductive traces 535 extend from the vertical connecting elements 25 in the upward direction, fill up the third via openings 533 to form third metallized vias 537 in direct contact with the vertical connecting elements 25, and extend laterally on the third dielectric layer 531.

The metal layer 53 and the plated layer 53' are shown as a single layer for convenience of illustration. The boundary (shown in broken lines) between the two metal layers may be difficult or impossible to detect since copper is plated on copper.

At this stage, the formation of a second routing circuitry 510 on the electronic component 20 and the stiffener 30 is accomplished. The second routing circuitry 510 laterally extends beyond peripheral edges of the first routing circuitry 210 and the encapsulant 28 and over a surface of the stiffener 30. In this illustration, the second routing circuitry 510 includes a third dielectric layer 531 and third conductive traces 535, and substantially has a combined surface area of the first routing circuitry 210 and the stiffener 30.

Figure 18:
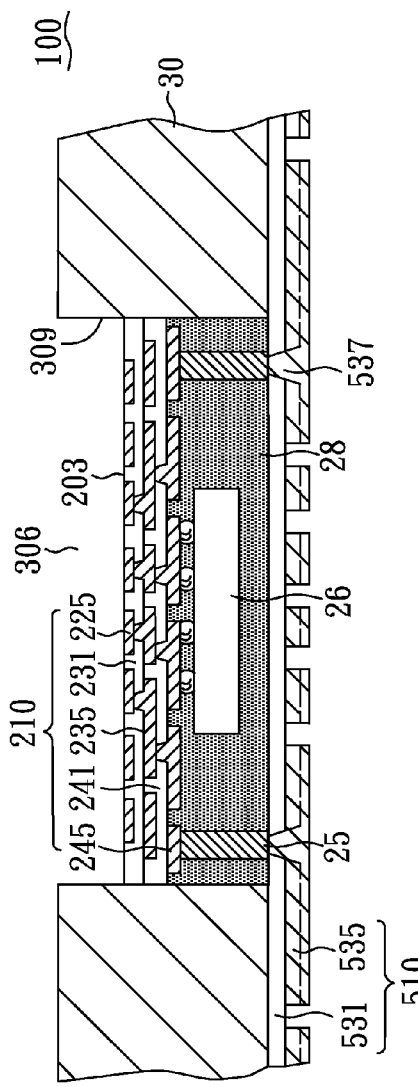
FIG. 18 is a cross-sectional view of the structure of FIG. 17 after removal of the carrier film and the sacrificial carrier to finish the fabrication of a wiring board in accordance with the first embodiment of the present invention.

FIG. 18 is a cross-sectional view of the structure after removal of the carrier film 40 and the sacrificial carrier 10. The carrier film 40 is detached from the sacrificial carrier 10 and the stiffener 30, followed by removing the sacrificial carrier 10 to expose the first routing circuitry 210 from above. The sacrificial carrier 10 can be removed by numerous techniques including wet chemical etching using acidic solution (e.g., ferric chloride, copper sulfate solutions), or alkaline solution (e.g., ammonia solution), electro-chemical etching, or mechanical process such as a drill or end mill followed by chemical etching In this embodiment, the sacrificial carrier 10 made of an iron-based material is removed by a chemical etching solution that is selective between copper and iron so as to prevent the copper routing traces 225 from being etched during removal of the sacrificial carrier 10.

Accordingly, as shown in FIG. 18, a wiring board 100 is accomplished and includes a first routing circuitry 210, an array of vertical connecting elements 25, a first semiconductor device 26, an encapsulant 28, a stiffener 30 and a second routing circuitry 510, and both the first routing circuitry 210 and the second routing circuitry 510 are buildup routing circuitries without a core layer. In this example, the vertical connecting elements 25 are illustrated as metal pillars. However, in some cases, the vertical connecting elements 25 may be solder balls, conductive vias or a combination thereof.

The first routing circuitry 210, the vertical connecting elements 25, the first semiconductor device 26 and the encapsulant 28 are positioned within the through opening 305 of the stiffener 30. The first routing circuitry 210 and the encapsulant 28 are adjacent to the interior sidewall surface 309 of the stiffener 30. The first semiconductor device 26 and the vertical connecting elements 25 are sealed in the encapsulant 28 and electrically connected to the first routing circuitry 210. The first routing circuitry 210 has an exposed surface 203 facing away from the first surface 281 of the encapsulant 28 and exposed from the through opening 305 of the stiffener 30. The second routing circuitry 510 is disposed beyond the through opening 305 of the stiffener 30 and disposed over the second surface 283 of the encapsulant 28, and laterally extends to peripheral edges of the wiring board 100. As such, the exposed surface 203 of the first routing circuitry 210 has a smaller area than that of the second routing circuitry 510 (namely, the area of the lower surface of the third dielectric layer 531).

The second routing circuitry 510 is electrically coupled to the vertical connecting elements 25 through the third metallized vias 537 of the second routing circuitry 510, and includes third conductive traces 535 extending into an area outside of the through opening 305 of the stiffener 30 and laterally extending over the a surface of the stiffener 30. As such, the second routing circuitry 510 not only provides further fan-out wiring structure, but also mechanically binds the electronic component 20 with the stiffener 30.

The stiffener 30 surrounds peripheral edges of the first routing circuitry 210 and the encapsulant 28 and laterally extends to the peripheral edges of the wiring board 100 and can provide mechanical support and suppress warping and bending of the wiring board 100. A portion of the interior sidewall surface 309 of the stiffener 30 and the exposed surface 203 of the first routing circuitry 210 form a cavity 306 in the through opening 305 of the stiffener 30.

Figure 19:
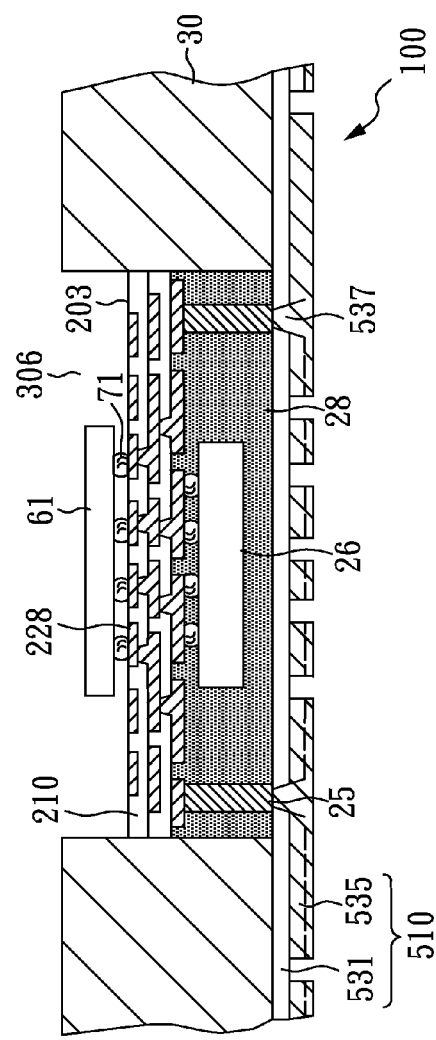
FIG. 19 is a cross-sectional view of a face-to-face semiconductor assembly with a second semiconductor device mounted on the wiring board of FIG. 18 in accordance with the first embodiment of the present invention.

FIG. 19 is a cross-sectional view of a face-to-face semiconductor assembly with a second semiconductor device 61, illustrated as a chip, mounted on the wiring board 100 illustrated in FIG. 18. The second semiconductor device 61 is positioned within the cavity 306 and is flip-chip mounted on the exposed bond pads 228 of the first routing circuitry 210 via bumps 71. The first routing circuitry 210 contains a pattern of traces that fan out from a finer pitch at the exposed surface 203 to a coarser pitch at the innermost surface in contact with the encapsulant 28. As a result, the first routing circuitry 210 can provide first level fan-out routing/interconnection for the second semiconductor device 61, and the second semiconductor device 61 is face-to-face electrically connected to the first semiconductor device 26 through the first routing circuitry 210 therebetween.

[Embodiment 2]

FIGS. 20-30 are schematic views showing a method of making a wiring board having conductive vias as the vertical connecting elements in accordance with the second embodiment of the present invention.

For purposes of brevity, any description in Embodiment 1 above is incorporated herein insofar as the same is applicable, and the same description need not be repeated.

Figure 20:
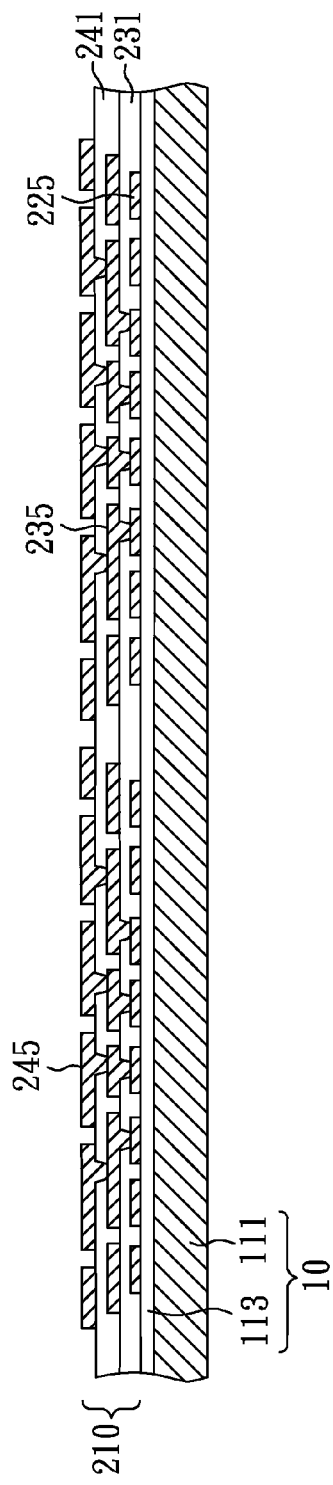
FIG. 20 is a cross-sectional view of the structure with a first routing circuitry formed on a sacrificial carrier in accordance with the second embodiment of the present invention.

FIG. 20 is a cross-sectional view of the structure with a first routing circuitry 210 detachably adhered over a sacrificial carrier 10. The structure, having the first routing circuitry 210 on the sacrificial carrier 10, is similar to that illustrated in FIG. 6, except that the sacrificial carrier 10 is a double-layer structure in this embodiment. The sacrificial carrier 10 includes a support sheet 111 and a barrier layer 113 deposited on the support sheet 111, and the first routing circuitry 210 is formed on the barrier layer 113. The barrier layer 113 can have a thickness of 0.001 to 0.1 mm, and may be a metal layer that is inactive against chemical etching during chemical removal of the support sheet 111 and can be removed without affecting the routing traces 225. For instance, the barrier layer 113 may be made of tin or nickel when the support sheet 111 and the routing traces 225 are made of copper. Further, in addition to metal materials, the barrier layer 113 can also be a dielectric layer such as a peelable laminate film. In this embodiment, the support sheet 111 is a copper sheet, and the barrier layer 113 is a nickel layer of 3 microns in thickness.

Figure 21:
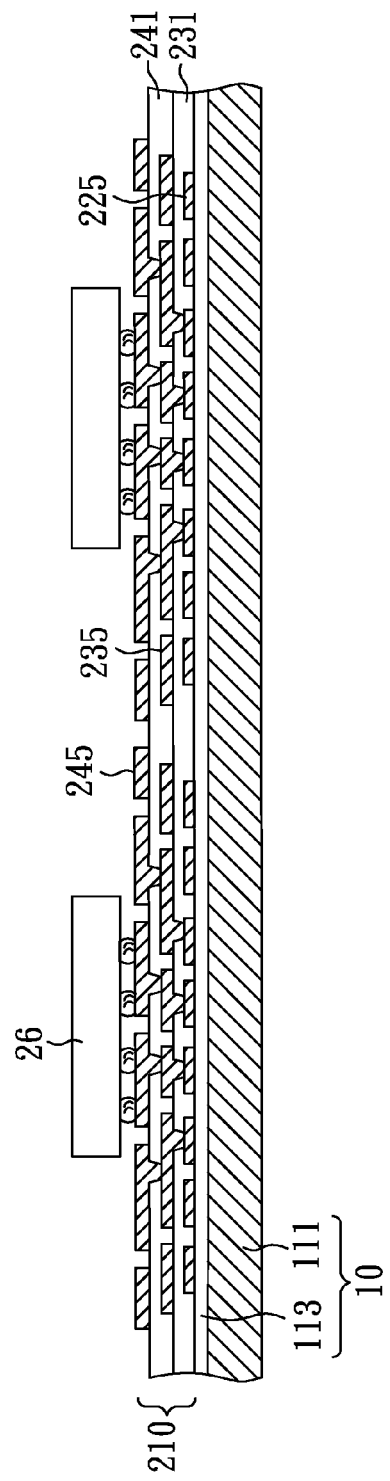
FIG. 21 is a cross-sectional view of the structure of FIG. 20 further provided with first semiconductor devices in accordance with the second embodiment of the present invention.

FIG. 21 is a cross-sectional view of the structure with first semiconductor devices 26 flip-chip mounted on the first routing circuitry 210. The first semiconductor devices 26 are electrically coupled to and contact the second conductive traces 245 of the first routing circuitry 210.

Figure 22:
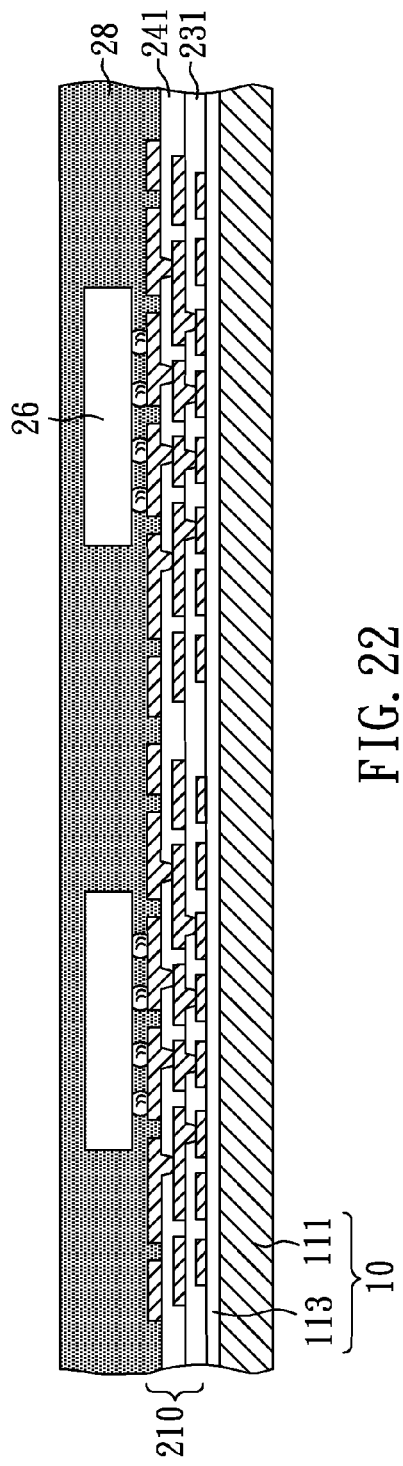
FIG. 22 is a cross-sectional view of the structure of FIG. 21 further provided with an encapsulant in accordance with the second embodiment of the present invention.

FIG. 22 is a cross-sectional view of the structure with an encapsulant 28 on the first semiconductor devices 26 and the first routing circuitry 210. The encapsulant 28 covers the first semiconductor devices 26 and the first routing circuitry 210 from above and surrounds and conformally coats and covers sidewalls of the first semiconductor devices 26.

Figure 23:
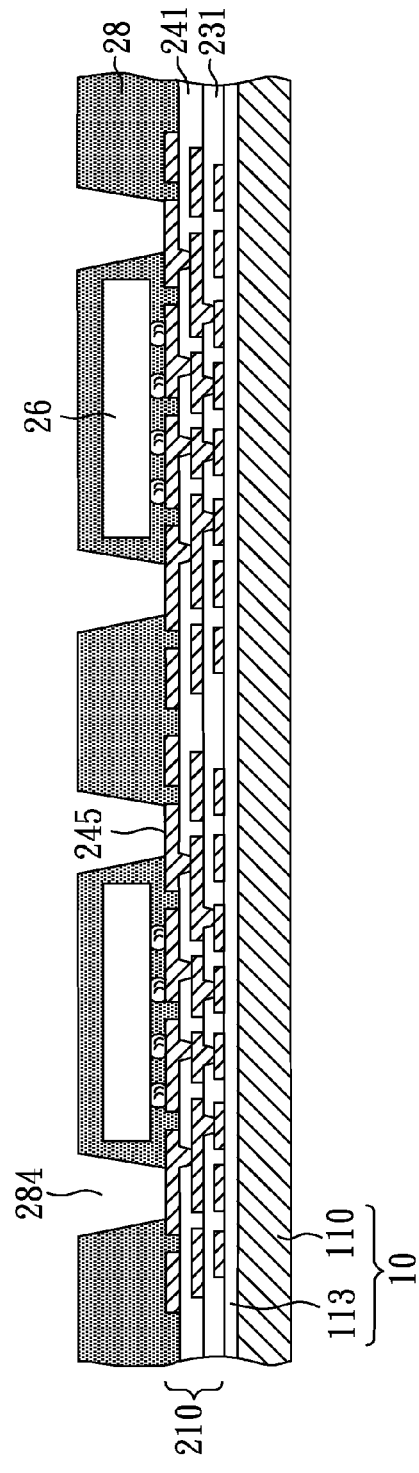
FIG. 23 is a cross-sectional view of the structure of FIG. 22 further provided with openings in accordance with the second embodiment of the present invention.

FIG. 23 is a cross-sectional view of the structure provided with openings 284 in the encapsulant 28. The openings 284 extend through the encapsulant 28 to expose selected portions of the second conductive traces 245 from above.

Figure 24:
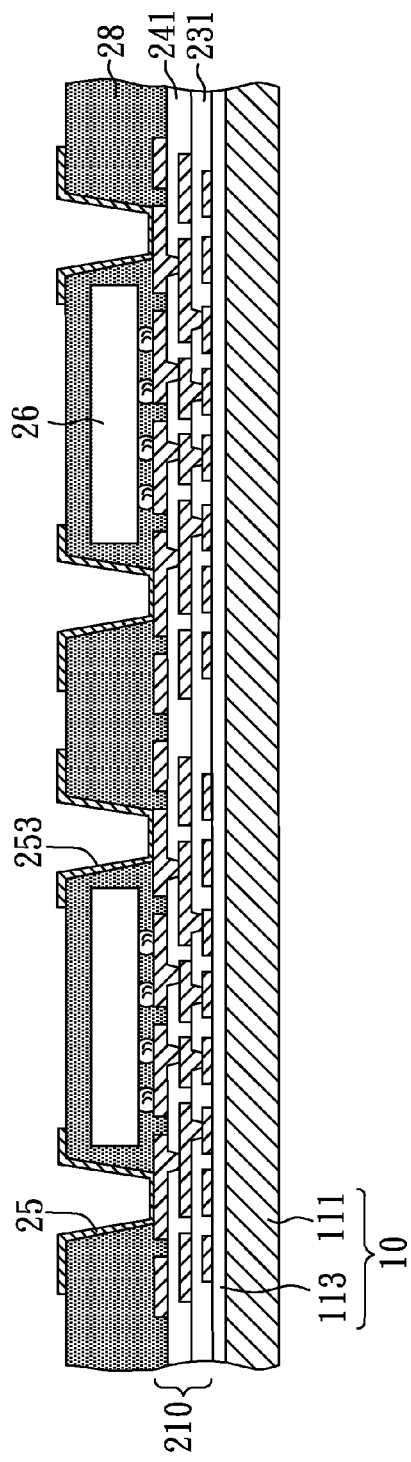
FIG. 24 is a cross-sectional view of the structure of FIG. 23 further provided with conductive vias in accordance with the second embodiment of the present invention.

FIG. 24 is a cross-sectional view of the structure provided with vertical connecting elements 25 in the encapsulant 28. In this example, the vertical connecting elements 25 are illustrated as conductive vias 253 and formed by metal deposition in the openings 284.

Figure 25:
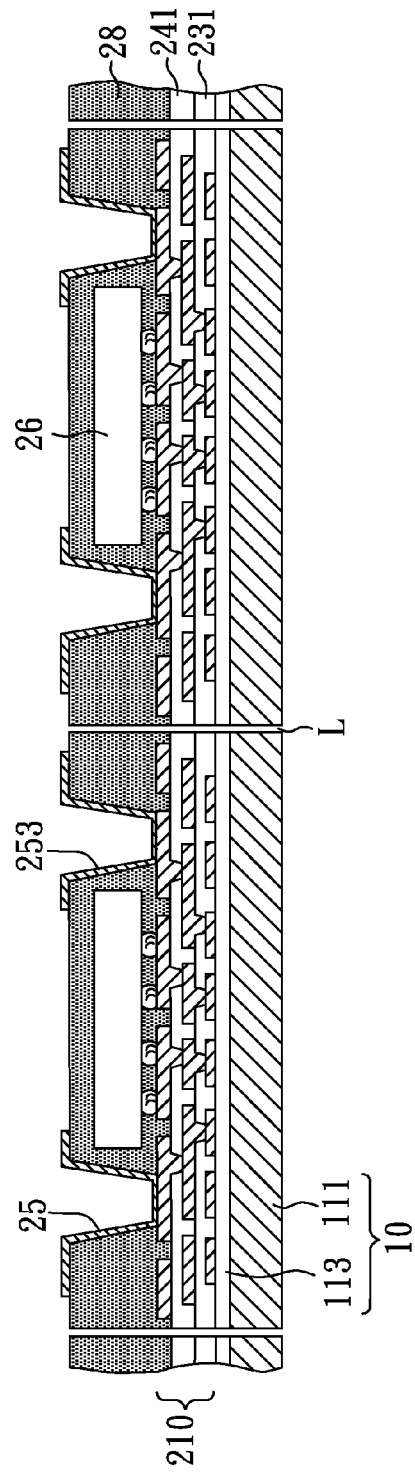
FIG. 25 is a cross-sectional view of a diced state of the panel-scale structure of FIG. 24 in accordance with the second embodiment of the present invention.

FIG. 25 is a cross-sectional view of the panel-scale structure of FIG. 24 diced into individual pieces. In this illustration, the panel-scale structure is singulated into individual pieces along dicing lines "L".

Figure 26:
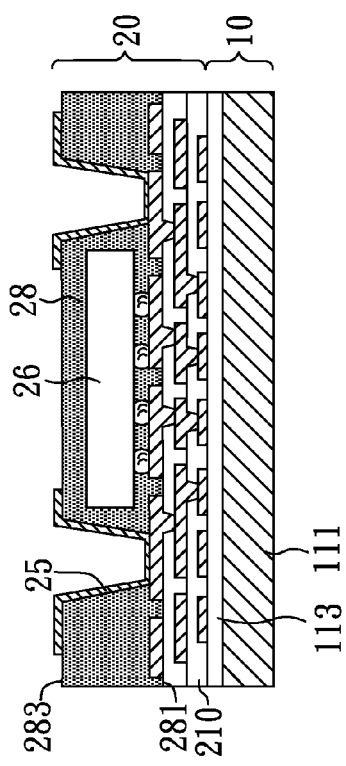
FIG. 26 is a cross-sectional view of the structure corresponding to a diced unit in FIG. 25 in accordance with the second embodiment of the present invention.

FIG. 26 is a cross-sectional view of an individual piece having a sacrificial carrier 10 and an electronic component 20. The electronic component 20 includes a first routing circuitry 210, an array of vertical connecting elements 25, a first semiconductor device 26 and an encapsulant 28. The first routing circuitry 210 is detachably attached to the sacrificial carrier 10 and adjacent to the first surface 281 of the encapsulant 28. The first semiconductor device 26 is embedded in the encapsulant 28 and flip-chip mounted to the first routing circuitry 210. The vertical connecting elements 25 are laterally covered by the encapsulant 28 and extend from the first routing circuitry 210 to the second surface 283 of the encapsulant 28.

Figure 27:
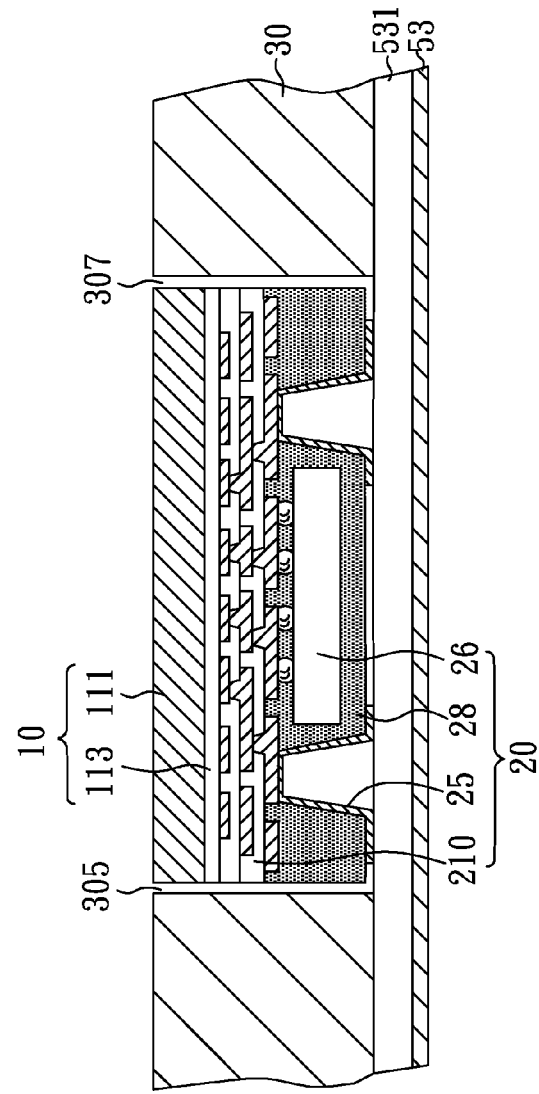
FIG. 27 is a cross-sectional view of the structure of FIG. 26 further provided with a stiffener, a third dielectric layer and a metal layer in accordance with the second embodiment of the present invention.

FIG. 27 is a cross-sectional view of the structure with the sacrificial carrier 10 and the electronic component 20 inserted into a through opening 305 of a stiffener 30 and placed on a third dielectric layer 531 and a metal layer 53. The third dielectric layer 531 is sandwiched between the electronic component 20 and the metal layer 53 and between the stiffener 30 and the metal layer 53. A gap 307 is located in the through opening 305 between the sacrificial carrier 10 and the stiffener 30 and the electronic component 20 and the stiffener 30. The gap 307 is laterally surrounded by the stiffener 30, and laterally surrounds the sacrificial carrier 10 and the electronic component 20.

Figure 28:
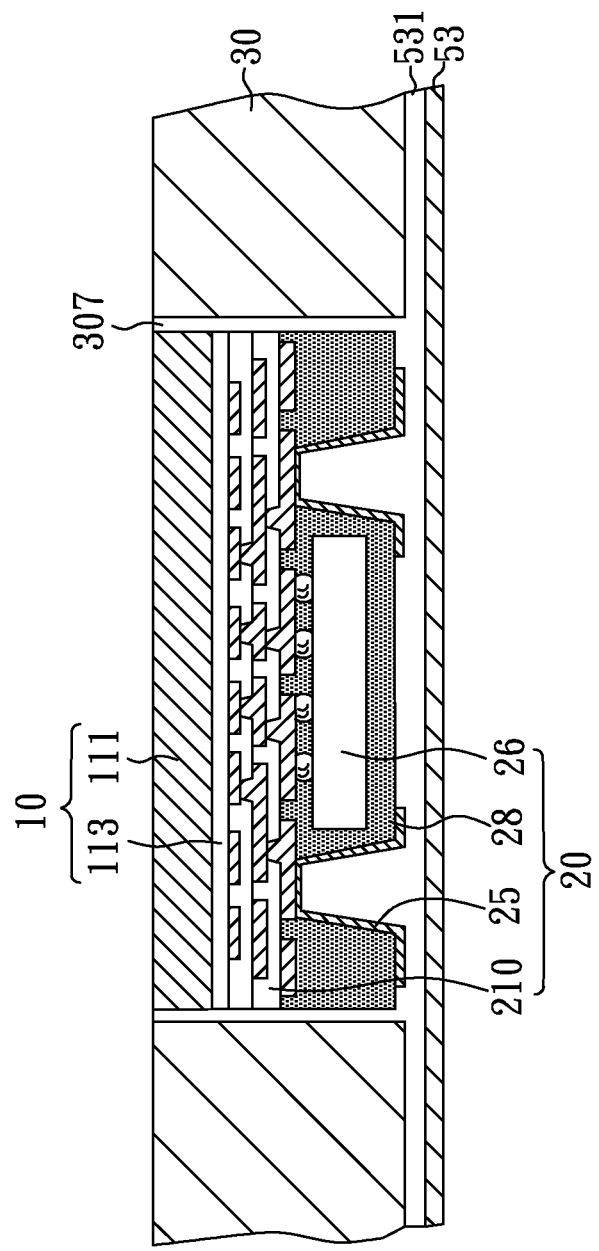
FIG. 28 is a cross-sectional view of the structure of FIG. 27 after a lamination process in accordance with the second embodiment of the present invention.

FIG. 28 is a cross-sectional view of the structure with some dielectric material squeezed out from the third dielectric layer 531 and into the gap 307 and the remaining space of the openings 284 in the encapsulant 28. The squeezed dielectric material from the third dielectric layer 531 is flowed into the gap 307 and the remaining space of the openings 284 by applying heat and pressure. Under the heat and pressure, the third dielectric layer 531 becomes compliant enough to conform to virtually any shape. As a result, the third dielectric layer 531 sandwiched between the electronic component 20 and the metal layer 53 and between the stiffener 30 and the metal layer 53 is compressed and forced out of its original shape, and part of the dielectric material of the third dielectric layer 531 is squeezed out and flows into the gap 307 and the remaining space of the openings 284 to fill the remaining space of the openings 284 and conformally coat the sidewalls of the through opening 305 and peripheral edges of the sacrificial carrier 10 and the electronic component 20. The squeezed dielectric material when solidified provides secure robust mechanical bonds between the sacrificial carrier 10 and the stiffener 30, between the electronic component 20 and the stiffener 30, between the electronic component 20 and the metal layer 53 and between the stiffener 30 and the metal layer 53, and thus retains the sacrificial carrier 10 and the electronic component 20 within the through opening 305 of the stiffener 30.

Figure 29:
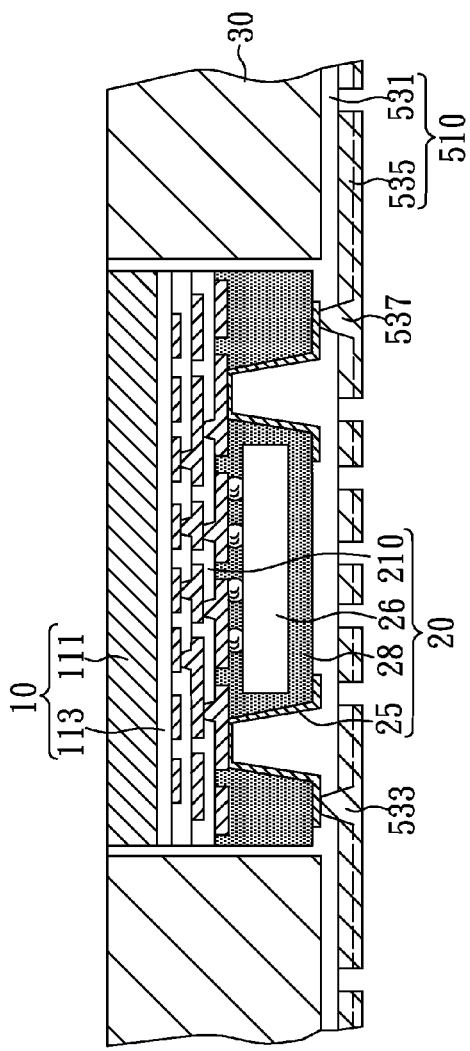
FIG. 29 is a cross-sectional view of the structure of FIG. 28 further provided with third conductive traces in accordance with the second embodiment of the present invention.

FIG. 29 is a cross-sectional view of the structure provided with the third via openings 533 in the third dielectric layer 531/metal layer 53 and third conductive traces 535 on the third dielectric layer 531. The third via openings 533 extend through the metal layer 53 and the third dielectric layer 531. The third conductive traces 535 are formed by depositing a plated layer 53' on the metal layer 53 and into the third via openings 533 and then patterning the metal layer 53 as well as the plated layers 53' thereon. The third conductive traces 535 fill up the third via openings 533 to form third metallized vias 537 in electrical connection with the vertical connecting elements 25, and extend laterally on the third dielectric layer 531.

At this stage, the formation of a second routing circuitry 510 on the electronic component 20 and the stiffener 30 is accomplished. In this illustration, the second routing circuitry 510 includes a third dielectric layer 531 and third conductive traces 535.

Figure 30:
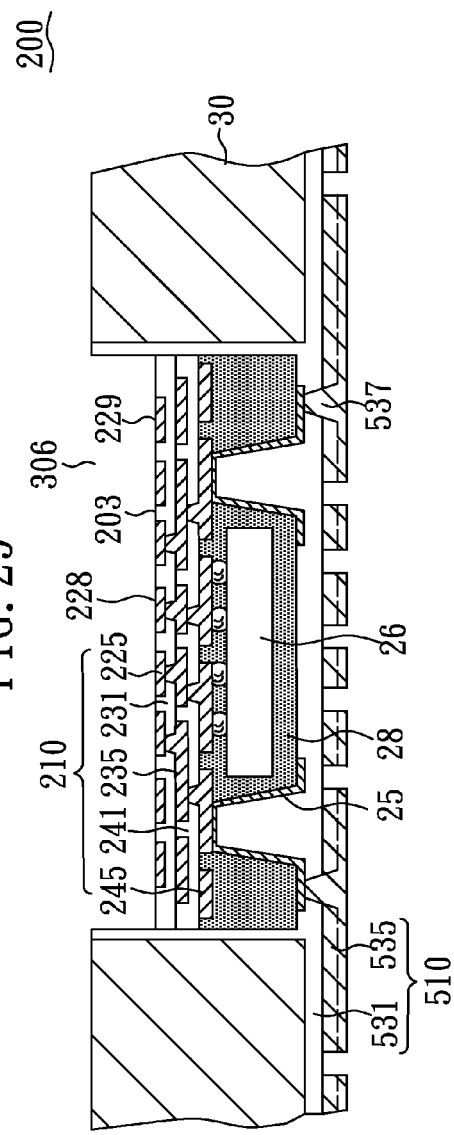
FIG. 30 is a cross-sectional view of the structure of FIG. 29 after removal of the sacrificial carrier to finish the fabrication of a wiring board in accordance with the second embodiment of the present invention.

FIG. 30 is a cross-sectional view of the structure after removal of the support sheet 111 and the barrier layer 113. The support sheet 111 made of copper is removed by an alkaline etching solution. The barrier layer 113 made of nickel is removed by an acidic etching solution to expose the first routing circuitry 210 from above. In another aspect of the barrier layer 113 being a peelable laminate film, the barrier layer 113 can be removed by mechanical peeling or plasma ashing. As a result, the first routing circuitry 210, positioned on the first surface 281 of the encapsulant 28, has an exposed surface 203 facing away from the first surface 281 of the encapsulant 28.

Accordingly, as shown in FIG. 30, a wiring board 200 is accomplished and includes a first routing circuitry 210, an array of vertical connecting elements 25, a first semiconductor device 26, an encapsulant 28, a stiffener 30 and a second routing circuitry 510.

The first routing circuitry 210, the vertical connecting elements 25, the first semiconductor device 26 and the encapsulant 28 are disposed within the through opening 305 of the stiffener 30, and the second routing circuitry 510 is disposed beyond the through opening 305 of the stiffener 30 and extends to peripheral edges of the wiring board 200. The first routing circuitry 210 and the second routing circuitry 510 are multi-layered routing circuitries positioned on the first surface 281 and the second surface 283 of the encapsulant 28, respectively. The first routing circuitry 210 has bond pads 228 and stacking pads 229 at its exposed surface 203 exposed from the through opening 305 of the stiffener 30 for device connection. The vertical connecting elements 25 are laterally surrounded by the encapsulant 28 and provide electrical connection between the first routing circuitry 210 and the second routing circuitry 510. The first semiconductor device 26 is flip-chip electrically coupled to the first routing circuitry 210 and further electrically connected to the second routing circuitry 510 through the first routing circuitry 210 and the vertical connecting elements 25. The second routing circuitry 510 laterally extends beyond peripheral edges of the first routing circuitry 210 and the encapsulant 28 and over a surface of the stiffener 30. The stiffener 30 extends beyond the exposed surface 203 of the first routing circuitry 210 in the upward direction to form a cavity 306 in the through opening 305 of the stiffener 30.

Figure 31:
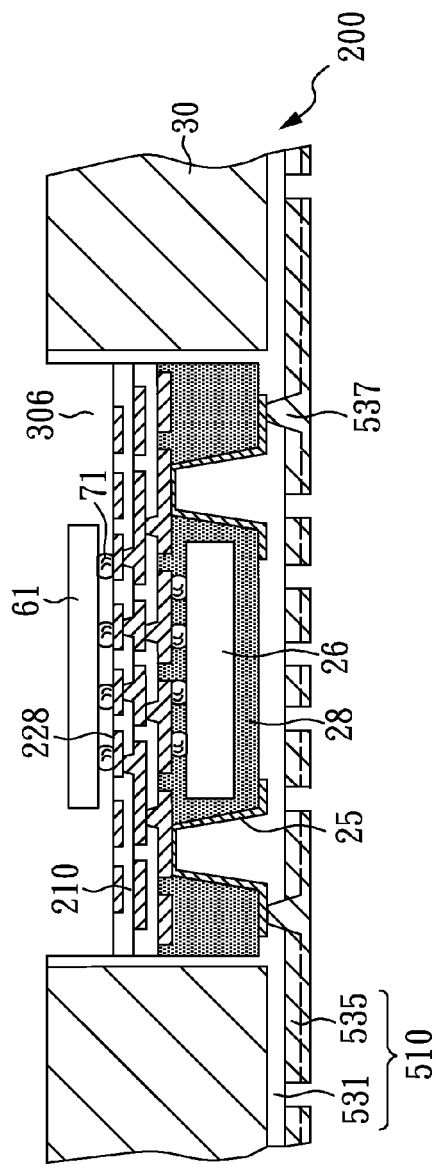
FIG. 31 is a cross-sectional view of a face-to-face semiconductor assembly with a second semiconductor device mounted on the wiring board of FIG. 30 in accordance with the second embodiment of the present invention.

FIG. 31 is a cross-sectional view of a face-to-face semiconductor assembly with a second semiconductor device 61 mounted on the first routing circuitry 210. The second semiconductor device 61, illustrated as a chip, is electrically coupled to the first routing circuitry 210 through bumps 71 on the bond pads 228 of the first routing circuitry 210.

[Embodiment 3]

FIGS. 32-40 are schematic views showing a method of making a wiring board with a heat spreader attached to the first semiconductor device in accordance with the third embodiment of the present invention.

For purposes of brevity, any description in Embodiments above is incorporated herein insofar as the same is applicable, and the same description need not be repeated.

Figure 32:
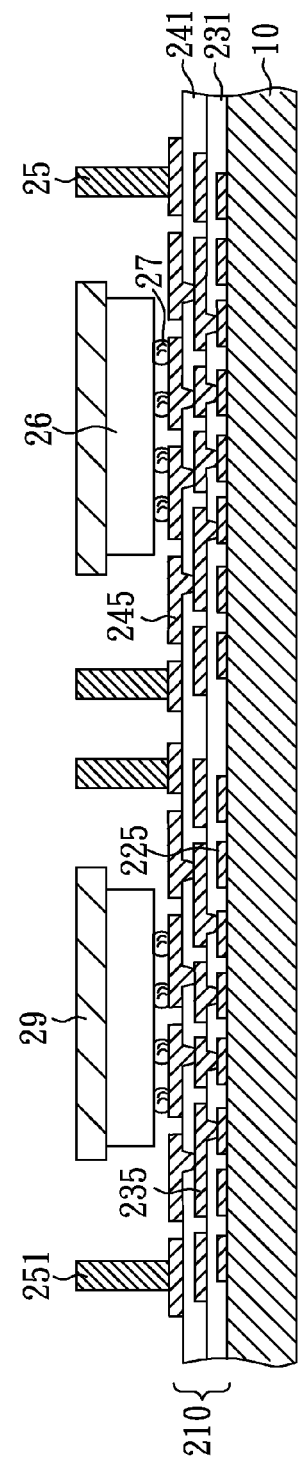
FIG. 32 is a cross-sectional view of the structure of FIG. 8 further provided with a heat spreader in accordance with the third embodiment of the present invention.

FIG. 32 is a cross-sectional view of the structure with a heat spreader 29 attached on the first semiconductor device 26 of FIG. 8. The heat spreader 29 can be made of any material with high thermal conductivity, such as metal, alloy, silicon, ceramic or graphite. The heat spreader 29 is attached on an inactive surface of the first semiconductor devices 26 using a thermally conductive adhesive (not shown in the figure).

FIG. 33 is a cross-sectional view of the structure with an encapsulant 28 on the first routing circuitry 210, the vertical connecting elements 25 and the heat spreader 29. The encapsulant 28 covers the first routing circuitry 210, the vertical connecting elements 25 and the heat spreader 29 from above and surrounds and conformally coats and covers sidewalls of the first semiconductor devices 26, the vertical connecting elements 25 and the heat spreader 29.

FIG. 34 is a cross-sectional view of the structure with the vertical connecting elements 25 and the heat spreader 29 exposed from above. In this illustration, the vertical connecting elements 25 and the heat spreader 29 each has an exposed surface substantially coplanar with an exterior surface of the encapsulant 28 from above.

Figure 35:
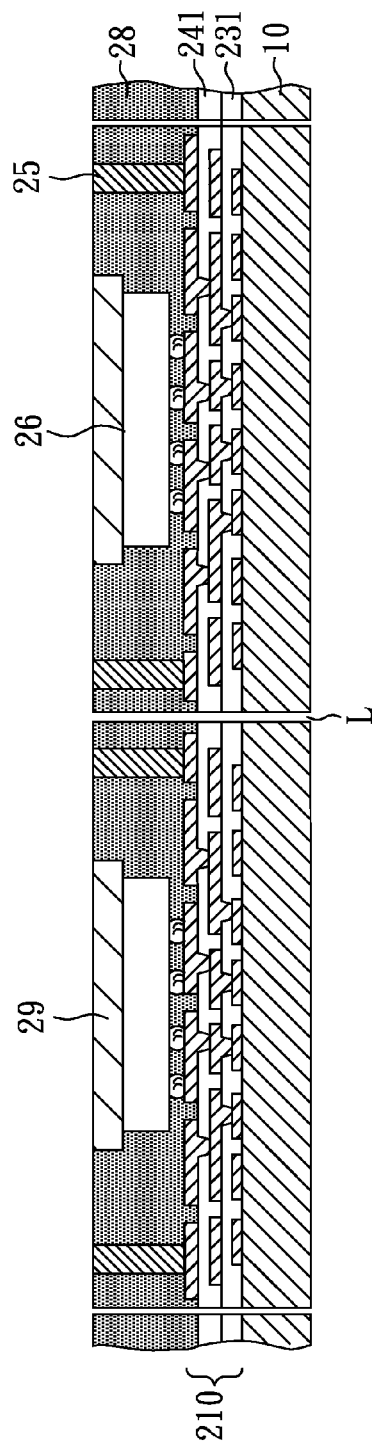
FIG. 35 is a cross-sectional view of a diced state of the panel-scale structure of FIG. 34 in accordance with the third embodiment of the present invention.

FIG. 35 is a cross-sectional view of the panel-scale structure of FIG. 34 diced into individual pieces. In this illustration, the panel-scale structure is singulated into individual pieces along dicing lines "L".

Figure 36:
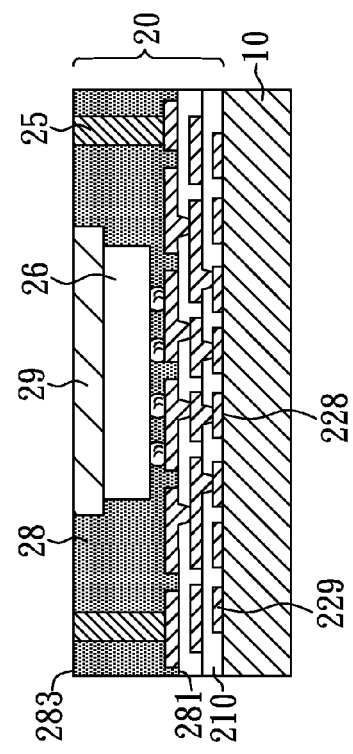
FIG. 36 is a cross-sectional view of the structure corresponding to a diced unit in FIG. 35 in accordance with the third embodiment of the present invention.

FIG. 36 is a cross-sectional view of an individual piece having a sacrificial carrier 10 and an electronic component 20. The electronic component 20 includes a first routing circuitry 210, an array of vertical connecting elements 25, a first semiconductor device 26, an encapsulant 28 and a heat spreader 29. The first routing circuitry 210 is detachably attached to the sacrificial carrier 10. The first semiconductor device 26 is embedded in the encapsulant 28 and flip-chip mounted to the first routing circuitry 210 and thermally conductible to the heat spreader 29. The vertical connecting elements 25 are sealed in the encapsulant 28 and electrically coupled to the first routing circuitry 210.

Figure 37:
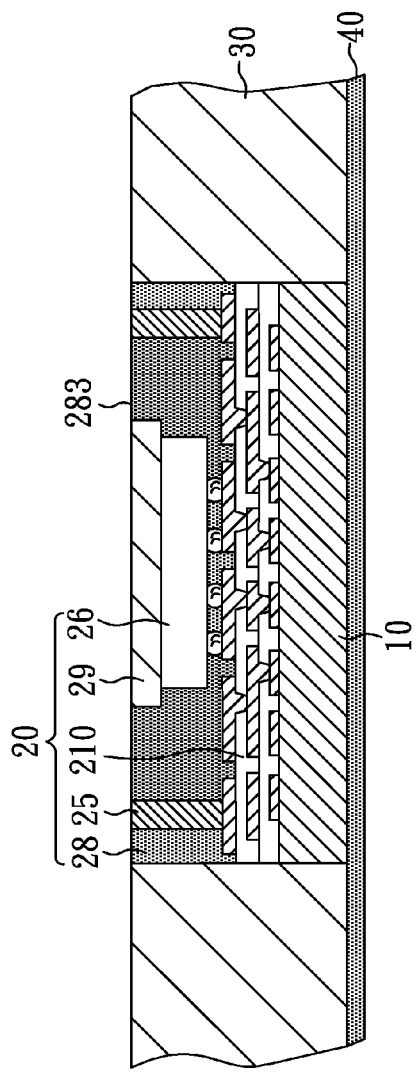
FIG. 37 is a cross-sectional view of the structure of FIG. 36 further provided with a stiffener and a carrier film in accordance with the third embodiment of the present invention.

FIG. 37 is a cross-sectional view of the structure with the sacrificial carrier 10 and the electronic component 20 inserted into a through opening 305 of a stiffener 30 and attached on the carrier film 40. The sacrificial carrier 10 contacts the carrier film 40, and the exposed surfaces of the vertical connecting elements 25, the encapsulant 28 and the heat spreader 29 are substantially coplanar with the exterior surface of the stiffener 30 from above.

Figure 38:
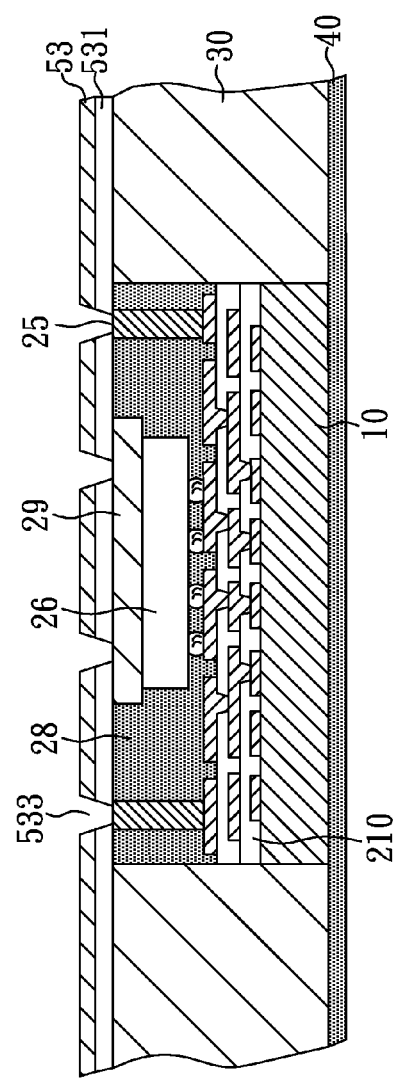
FIG. 38 is a cross-sectional view of the structure of FIG. 37 further provided with a third dielectric layer, a metal layer and third via openings in accordance with the third embodiment of the present invention.

FIG. 38 is a cross-sectional view of the structure with a third dielectric layer 531 and a metal layer 53 laminated/coated on the electronic component 20 and the stiffener 30 and third via openings 533 formed in the metal layer 53/the third dielectric layer 531. The third dielectric layer 531 is sandwiched between the electronic component 20 and the metal layer 53 and between the stiffener 30 and the metal layer 53. The third via openings 533 extend through the metal layer 53 and the third dielectric layer 531, and are aligned with selected portions of the vertical connecting elements 25 and the heat spreader 29.

FIG. 39 is a cross-sectional view of the structure provided with third conductive traces 535 on the third dielectric layer 531 by depositing a plated layer 53' on the metal layer 53 and into the third via openings 533 and then patterning the metal layer 53 as well as the plated layer 53' thereon. The third conductive traces 535 extend from the vertical connecting elements 25 and the heat spreader 29 in the upward direction, fill up the third via openings 533 to form third metallized vias 537 in direct contact with the vertical connecting elements 25 and the heat spreader 29, and extend laterally on the third dielectric layer 531.

At this stage, the formation of a second routing circuitry 510 on the electronic component 20 and the stiffener 30 is accomplished. In this illustration, the second routing circuitry 510 includes a third dielectric layer 531 and third conductive traces 535.

FIG. 40 is a cross-sectional view of the structure after removal of the carrier film 40 and the sacrificial carrier 10. The carrier film 40 is detached from the sacrificial carrier 10 and the stiffener 30, followed by removing the sacrificial carrier 10 to expose the first routing circuitry 210.

Accordingly, as shown in FIG. 40, a wiring board 300 is accomplished and includes a first routing circuitry 210, an array of vertical connecting elements 25, a first semiconductor device 26, an encapsulant 28, a heat spreader 29, a stiffener 30 and a second routing circuitry 510. The first routing circuitry 210, the vertical connecting elements 25, the first semiconductor device 26, the encapsulant 28 and the heat spreader 29 are disposed within the through opening 305 of the stiffener 30, and the second routing circuitry 510 is disposed beyond the through opening 305 of the stiffener 30 and extends to peripheral edges of the wiring board 300. The first routing circuitry 210 and the second routing circuitry 510 are positioned on opposite sides of the encapsulant 28 and electrically connected to each other by the vertical connecting elements 25 in the encapsulant 28. The first semiconductor device 26 is flip-chip electrically coupled to the first routing circuitry 210 and sealed in the encapsulant 28. The heat spreader 29 provides thermal dissipation pathway for the first semiconductor device 26. The second routing circuitry 510 is electrically coupled to the vertical connecting elements 25 and thermally conductible to the heat spreader 29 through the third metallized vias 537.

[Embodiment 4]

Figure 41:
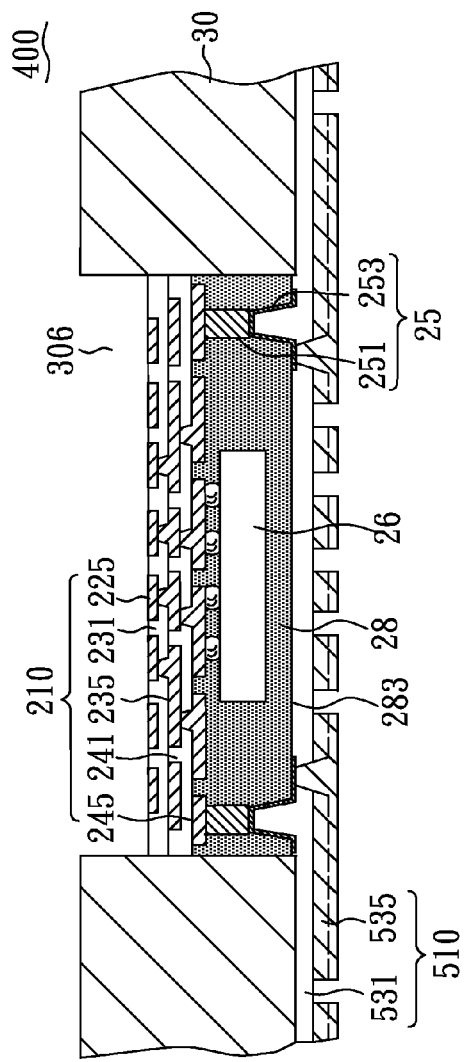
FIG. 41 is a cross-sectional view of another wiring board in accordance with the fourth embodiment of the present invention.

FIG. 41 is a cross-sectional view of another wiring board with metal pillars and conductive vias sealed in the encapsulant in accordance with the fourth embodiment of the present invention.

In this embodiment, the wiring board 400 is manufactured in a manner similar to that illustrated in Embodiment 1, except that the vertical connecting elements 25 include a combination of metal pillars 251 and conductive vias 253. The metal pillars 251 contact the second conductive traces 245 of the first routing circuitry 210, and the conductive vias 253 extend from the metal pillars 251 to the second surface 283 of the encapsulant 28.

[Embodiment 5]

Figure 42:
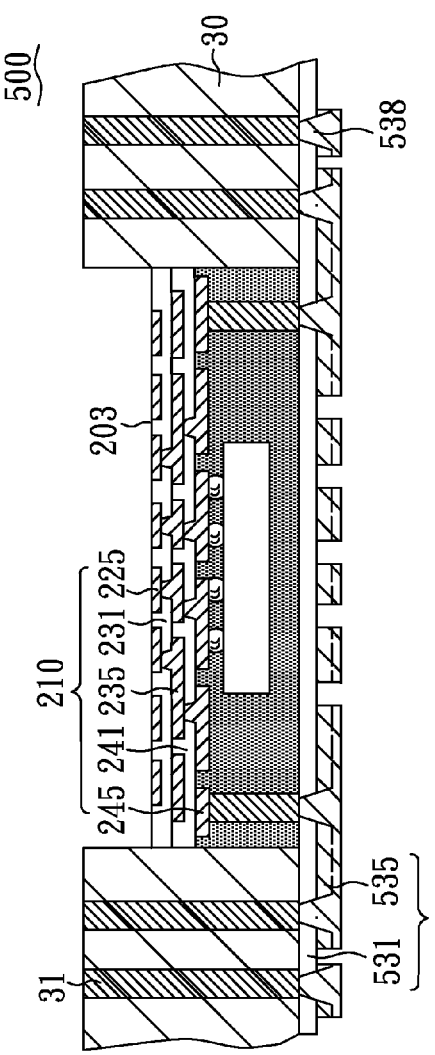
FIG. 42 is a cross-sectional view of yet another wiring board in accordance with the fifth embodiment of the present invention.

FIG. 42 is a cross-sectional view of yet another wiring board with the additional vertical connecting elements in the stiffener in accordance with the fifth embodiment of the present invention.

In this embodiment, the wiring board 500 is manufactured in a manner similar to that illustrated in Embodiment 1, except that additional vertical connecting elements 31 are formed in the stiffener 30 and electrically coupled to the second routing circuitry 510 through additional third metallized vias 538 in the third dielectric layer 531. In this example, the additional vertical connecting elements 31 in the stiffener 30 are illustrated as metal pillars. However, like the vertical connecting elements 25 in the encapsulant 28, the vertical connecting elements 31 in the stiffener 30 may be solder balls, conductive vias or a combination thereof.

Figure 43:
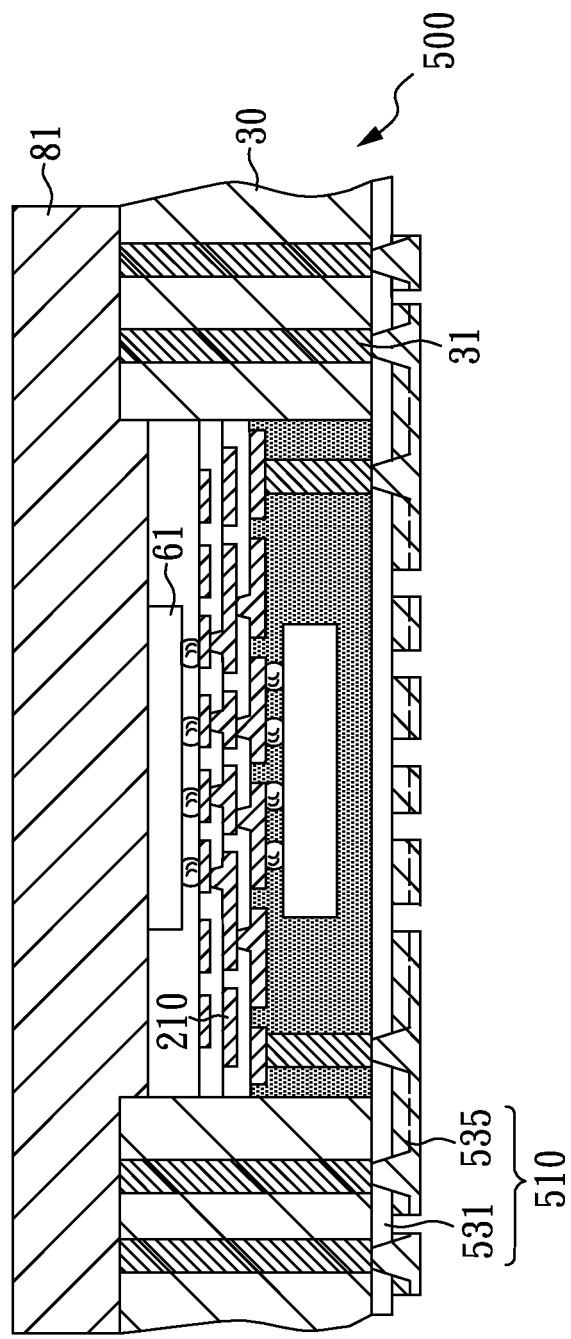
FIG. 43 is a cross-sectional view of a face-to-face semiconductor assembly with a second semiconductor device and a heat spreader mounted on the wiring board of FIG. 42 in accordance with the fifth embodiment of the present invention.

FIG. 43 is a cross-sectional view of a face-to-face semiconductor assembly with a second semiconductor device 61 and a heat spreader 81 attached to the wiring board 500 of FIG. 42. The second semiconductor device 61 is flip-chip mounted on the first routing circuitry 210. The heat spreader 81 is thermally conductible to the second semiconductor device 61 and electrically coupled to the vertical connecting elements 31 in the stiffener 30 for grounding.

Figure 44:
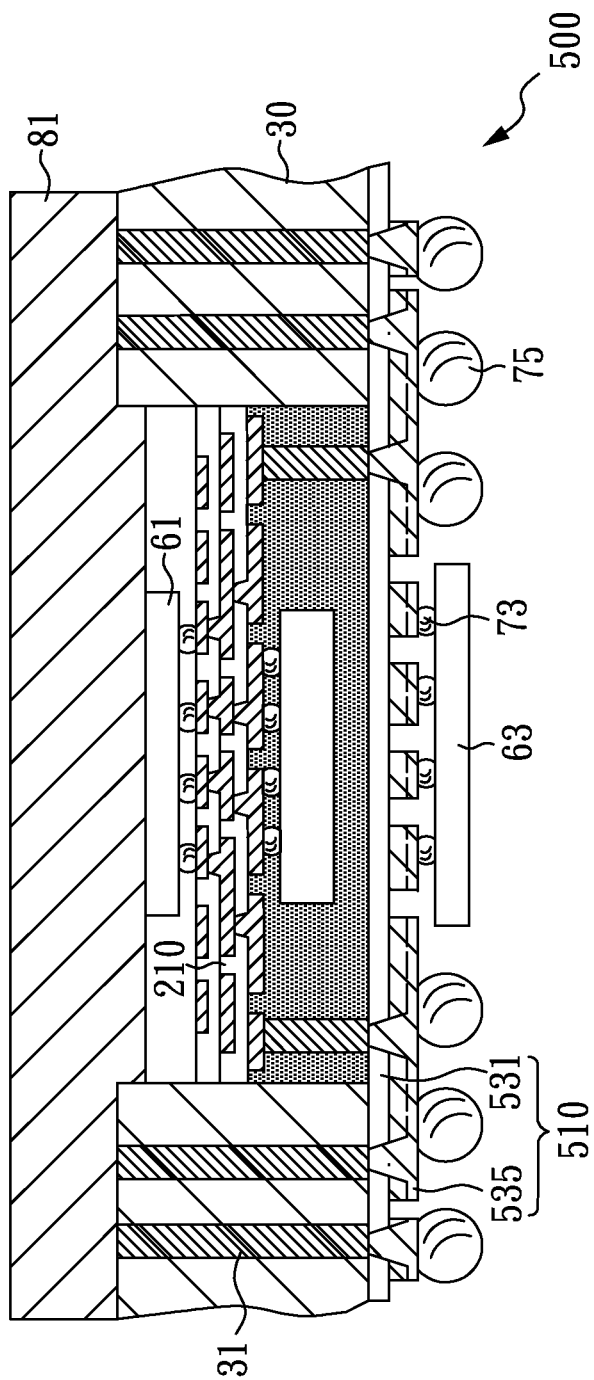
FIG. 44 is a cross-sectional view of the structure with a third semiconductor device and solder balls mounted on the face-to-face semiconductor assembly of FIG. 43 in accordance with the fifth embodiment of the present invention.

FIG. 44 is a cross-sectional view of the structure with a third semiconductor device 63 and solder balls 75 mounted on the second routing circuitry 510 of the face-to-face semiconductor assembly of FIG. 43. The third semiconductor device 63 is flip-chip mounted on the third conductive traces 535 of the second routing circuitry 510 via bumps 73. The solder balls 75 are mounted on the third conductive traces 535 of the second routing circuitry 510 and surround the third semiconductor device 63.

Figure 45:
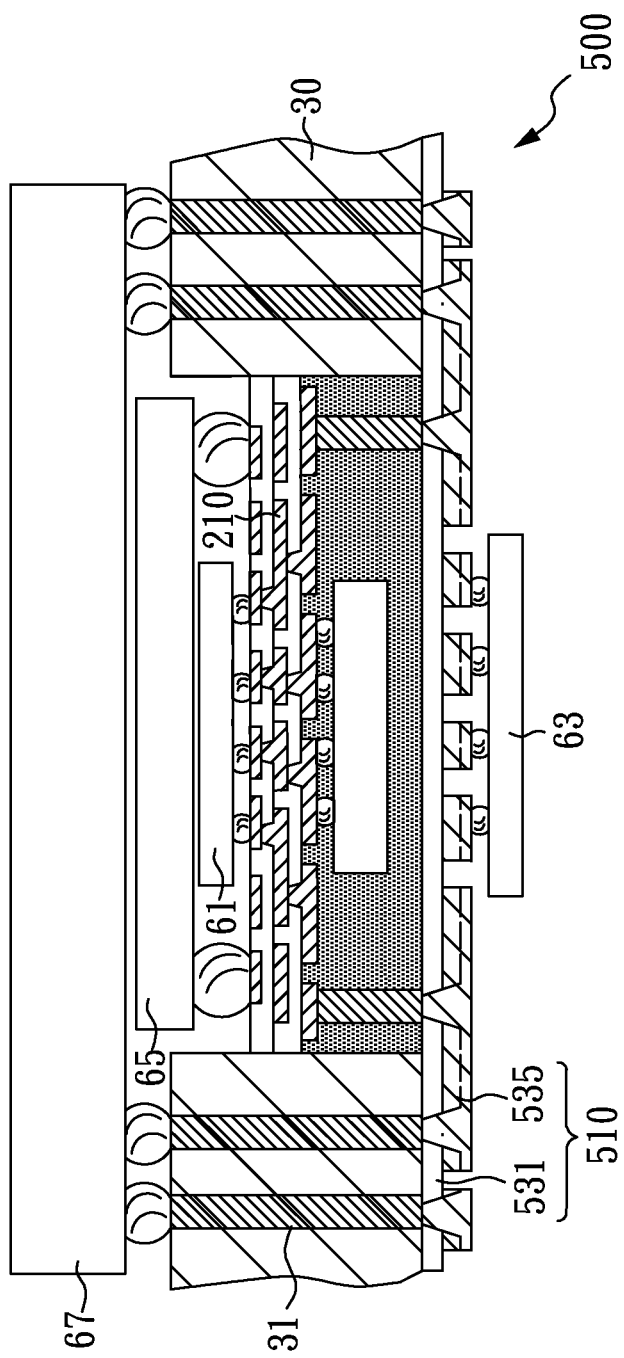
FIG. 45 is a cross-sectional view of the structure with a second semiconductor device, a third semiconductor device, a fourth semiconductor device and a fifth semiconductor device attached to the wiring board of FIG. 42 in accordance with the fifth embodiment of the present invention.

FIG. 45 is a cross-sectional view of the structure with a second semiconductor device 61, a third semiconductor device 63, a fourth semiconductor device 65 and a fifth semiconductor device 67 attached to the wiring board 500 of FIG. 42. The second semiconductor device 61 is disposed within the cavity 306 of the wiring board 500 and electrically coupled to the bond pads 228 of the first routing circuitry 210. The third semiconductor device 63 is flip-chip mounted on the third conductive traces 535 of the second routing circuitry 510. The fourth semiconductor device 65 is disposed over the second semiconductor device 61 and electrically coupled to the stacking pads 229 of the first routing circuitry 210. The fifth semiconductor device 67 is disposed over the fourth semiconductor device 65 and the stiffener 30 and electrically coupled to the vertically connecting elements 31 in the stiffener 30.

The wiring board and assemblies described above are merely exemplary. Numerous other embodiments are contemplated. In addition, the embodiments described above can be mixed-and-matched with one another and with other embodiments depending on design and reliability considerations. For instance, the stiffener may include multiple through openings arranged in an array and each through opening accommodates an electronic component therein. Also, the second routing circuitry can include additional conductive traces to receive and route additional electronic component.

As illustrated in the aforementioned embodiments, a distinctive wiring board is configured to exhibit improved reliability, which includes a stiffener, a first routing circuitry, a first semiconductor device, an array of vertical connecting elements, an encapsulant and a second routing circuitry. For the convenience of below description, the direction in which the first surface of the encapsulant faces is defined as the first direction, and the direction in which the second surface of the encapsulant faces is defined as the second direction. The first routing circuitry is disposed adjacent to the first surface of the encapsulant and has an exposed surface facing in the first direction.

The first semiconductor device can be a packaged or unpackaged chip. For instance, the first semiconductor device can be a bare chip, or a wafer level packaged die, etc. Alternatively, the first semiconductor device can be a stacked-die chip. In a preferred embodiment, the first semiconductor device is electrically coupled to the first routing circuitry detachably adhered over a sacrificial carrier, followed by providing the vertical connecting elements and the encapsulant over the first routing circuitry to form an electronic component over the sacrificial carrier. In this case, the first semiconductor device can be electrically coupled to the first routing circuitry using bumps with its active surface facing the first routing circuitry. Preferably, the combination of the electronic component and the sacrificial carrier is fabricated by a panel scale process followed by a singulation process. Further, before the step of providing the encapsulant, a heat spreader may be attached to the first semiconductor device. As a result, the heat generated by the first semiconductor device can be conducted away through the heat spreader.

The stiffener has a through opening and may be a single or multi-layer structure optionally with embedded single-level conductive traces or multi-level conductive traces. In a preferred embodiment, the stiffener surrounds peripheral edges of the electronic component and laterally extends to the peripheral edges of the wiring board. The stiffener can be made of any material which has enough mechanical robustness, such as metal, composites of metal, ceramic, resin or other non-metallic materials. Accordingly, the stiffener located around peripheral edges of the first routing circuitry and the encapsulant can provide mechanical support for the wiring board to suppress warping and bending of the wiring board. Furthermore, additional vertical connecting elements may be formed in the stiffener to provide electrical contacts for another semiconductor device or for a heat spreader mounted on the stiffener from the first direction. The additional vertical connecting elements in the first stiffener can include, but not limited to, metal pillars, solder balls, conductive vias or a combination thereof.

The vertical connecting elements in the encapsulant can include metal pillars, solder balls, conductive vias or a combination thereof and provide electrical contacts for next routing circuitry connection. The vertical connecting elements can be formed to be electrically connected to the first routing circuitry before or after provision of the encapsulant. In a preferred embodiment, the surface, adjacent to the second routing circuitry, of the vertical connecting elements may be substantially coplanar with the second surface of the encapsulant, and the surface, adjacent to the second routing circuitry, of the stiffener in the second direction.

The first and second routing circuitries can be buildup routing circuitries without a core layer and disposed within and beyond the through opening of the stiffener, respectively. The second routing circuitry laterally extends beyond the peripheral edges of the first routing circuitry, and can have a larger surface area than that of the first routing circuitry. Preferably, the second routing circuitry extends to peripheral edges of the wiring board and substantially has a combined surface area of the first routing circuitry and the stiffener. The first and second routing circuitries each can include at least one dielectric layer and conductive traces that fill up via openings in the dielectric layer and extend laterally on the dielectric layer. The dielectric layer and the conductive traces are serially formed in an alternate fashion and can be in repetition when needed.

The first routing circuitry can be formed to include routing traces on the sacrificial carrier, a dielectric layer on the routing traces and the sacrificial carrier, and conductive traces that extend from selected portions of the routing traces and fill up via openings in the dielectric layer to form metallized vias and laterally extend on the dielectric layer. Further, the first routing circuitry may include additional dielectric layers, additional via openings, and additional conductive traces if needed for further signal routing. Also, the first routing circuitry may optionally include one or more passive components embedded therein. In the present invention, the step of forming the first routing circuitry on the sacrificial carrier can be executed by directly forming the first routing circuitry on the sacrificial carrier, or by separately forming and then detachably adhering the first routing circuitry to the sacrificial carrier. For the first routing circuitry, the routing traces can includes bond pads that match chip I/O pads, whereas the conductive traces adjacent to the encapsulant can have larger pad size and pad pitch than that of the bond pads. Optionally, the routing traces may further include stacking pads to provide electrical contacts for another semiconductor device such as a plastic package or another semiconductor assembly. As a result, the first routing circuitry can be a multi-layered routing circuitry, and have bond pads and optional stacking pads at its exposed surface. Accordingly, in a preferred embodiment, the first routing circuitry has a pattern of traces that fan out from a finer pitch at the bonds pads to a coarser pitch at the conductive traces adjacent to the encapsulant, and provides first level fan-out routing/interconnection for a second semiconductor device to be assembled on its exposed surface. The surfaces, facing in the first direction, of the bond pads, the optional stacking pads and the dielectric layer adjacent to the sacrificial carrier can be substantially coplanar with each other. Further, the stiffener can extend beyond the exposed surface of the first routing circuitry in the first direction so as to form a cavity in the through opening of the stiffener after removing the sacrificial carrier to expose the first routing circuitry. Accordingly, a second semiconductor device can be positioned within the cavity and electrically coupled to the bond pads exposed from the cavity. Optionally, an adhesive may be dispensed in a gap located in the through opening between the electronic component and the stiffener after the electronic component is inserted into the through opening of the stiffener, thereby providing secure robust mechanical bonds between the electronic component and the stiffener. Alternatively, the gap between the electronic component and the stiffener may be filled with a dielectric material squeezed out from a dielectric layer of the second routing circuitry. Accordingly, the interior sidewall surface of the through opening and the peripheral edges of the first routing circuitry, the encapsulant and the sacrificial carrier can be coated with the adhesive or the dielectric material.

The second routing circuitry can be formed on the second surface of the encapsulant and laterally extend over a surface of the stiffener to provide further fan-out routing/interconnection after the insertion of the electronic component and the sacrificial carrier into the through opening of the stiffener. As the second routing circuitry can be electrically coupled to the vertical connecting elements of the electronic component through metallized vias of the second routing circuitry, the electrical connection between the vertical connecting elements and the second routing circuitry can be devoid of soldering material. Also, the interface between the stiffener and the second routing circuitry and between the encapsulant and the second routing circuitry can be devoid of solder or adhesive. More specifically, the second routing circuitry can be formed to include a dielectric layer on the encapsulant and the stiffener, and conductive traces that extend from the vertical connecting elements in the encapsulant and from the optional heat spreader on the first semiconductor device, and optionally from the stiffener or the additional connecting vertical elements in the stiffener, and fill up via openings in the dielectric layer of the second routing circuitry and laterally extend on the dielectric layer of the second routing circuitry. As a result, the second routing circuitry can contact and be electrically coupled to the vertical connecting elements of the electronic component for signal routing, and optionally electrically coupled to the stiffener for ground connection or optionally further electrically coupled to the optional vertical connecting elements in the stiffener for signal routing or grounding, and optionally thermally conductible to the heat spreader mounted on the first semiconductor device. Further, the second routing circuitry may include additional dielectric layers, additional via openings, and additional conductive traces if needed for further signal routing. The outmost conductive traces of the second routing circuitry can accommodate conductive joints, such as bumps and solder balls, for electrical communication and mechanical attachment with for the next level assembly or another electronic device.

Before the formation of the second routing circuitry, a carrier film (typically an adhesive tape) may be used to provide temporary retention force. For instance, the carrier film can temporally adhere to the sacrificial carrier and the stiffener to retain the electronic component and the sacrificial carrier within the through opening of the stiffener, optionally followed by dispensing an adhesive in a gap between the stiffener and the electronic component and between the stiffener and the sacrificial carrier. After the second routing circuitry is formed on the electronic component and the stiffener, the carrier film can be detached therefrom. As an alternative, the electronic component/sacrificial carrier and the stiffener may be directly positioned on an dielectric layer, with electronic component and the stiffener in contact with the dielectric layer, followed by bonding the dielectric layer to the electronic component and the stiffener, preferably with partial dielectric material squeezed out form the dielectric layer and flowed into the gap between the electronic component and the stiffener and between the sacrificial carrier and the stiffener. As a result, the dielectric material squeezed out from the dielectric layer can provide secure robust mechanical bonds between the electronic component and the stiffener and retain the electronic component within the through opening of the stiffener. Subsequently, the second routing circuitry, including the dielectric layer bonded to the electronic component and the stiffener, can be formed to electrically couple the vertical connecting elements of the electronic component.

The sacrificial carrier, which provides rigidity support for the electronic component, can be detached from the first routing circuitry by a chemical etching process or a mechanical peeling process preferably after the formation of the second routing circuitry. The sacrificial carrier can have a thickness of 0.1 mm to 2.0 mm and may be made of any conductive or non-conductive material, such as copper, nickel, chromium, tin, iron, stainless steel, silicon, glass, graphite, plastic film, or other metal or non-metallic materials. For the aspect of detaching the sacrificial carrier by a chemical etching process, the sacrificial carrier typically is made of chemically removable materials. In consideration of the bond pads in contact with the sacrificial carrier not being etched during removal of the sacrificial carrier, the sacrificial carrier may be made of nickel, chromium, tin, iron, stainless steel, or any other material that can be removed using an etching solution inactive to the bond pads as well as the optional stacking pads made of copper. Alternatively, the bond pads as well as the optional stacking pads are made of any stable material against etching during removal of the sacrificial carrier. For instance, the bond pads as well as the optional stacking pads may be gold pads in the case of the sacrificial carrier being made of copper. Additionally, the sacrificial carrier also can be a multi-layer structure having a barrier layer and a support sheet, and the first routing circuitry is formed on the barrier layer of the sacrificial carrier. As the first routing circuitry is spaced from the support sheet by a barrier layer disposed therebetween, the support sheet can be removed without damage on the routing traces of the first routing circuitry even the routing traces and the support sheet are made of the same material. The barrier layer may be a metal layer that is inactive against chemical etching during chemically removing the support sheet and can be removed using an etching solution inactive to the routing traces. For instance, the support sheet made of copper or aluminum may be provided with a nickel, chromium or titanium layer as the barrier layer on its surface, and the routing traces made of copper or aluminum are deposited on the nickel, chromium or titanium layer. Accordingly, the nickel, chromium or titanium layer can protect the routing traces from etching during removal of the support sheet. As an alternative, the barrier layer may be a dielectric layer that can be removed by for example, a mechanical peeling or plasma ashing process. For instance, a release layer may be used as a barrier layer disposed between the support sheet and the first routing circuitry, and the support sheet can be removed together with the release layer by a mechanical peeling process.

The present invention also provides a face-to-face semiconductor assembly in which a second semiconductor device is electrically coupled to the bond pads of the aforementioned wiring board. Specifically, the second semiconductor device can be positioned in the cavity of the wiring board and electrically connected to the wiring board using various using a wide variety of connection media such as bumps on the bond pads of the wiring board. Accordingly, the second semiconductor device can be electrically connected to the first semiconductor device through the first routing circuitry therebetween, and further electrically connected to the second routing circuitry through the first routing circuitry and the vertical connecting elements. In the face-to-face semiconductor assembly, the first routing circuitry can offer the shortest interconnection distance between the first semiconductor device and second semiconductor device. Optionally, a filler material can be further provided to fill the gap between the second semiconductor device and the first routing circuitry of the wiring board. The second semiconductor device can be a packaged or unpackaged chip. For instance, the second semiconductor device can be a bare chip, or a wafer level packaged die, etc. Alternatively, the second semiconductor device can be a stacked-die chip.

Moreover, an additional semiconductor device may be further provided and electrically coupled to the stacking pads of the wiring board using conductive joints such as solder balls. For instance, the additional semiconductor device can be positioned above the second semiconductor device and electrically coupled to the stacking pads of the wiring board. Alternatively, a heat spreader may be attached to an inactive surface of the second semiconductor device. The heat spreader can laterally extend over a surface of the stiffener and be electrically coupled to the optional vertical connecting elements in the stiffener for grounding.

The term "cover" refers to incomplete or complete coverage in a vertical and/or lateral direction. For instance, in the cavity-up position, the second routing circuitry covers the first routing circuitry in the downward direction regardless of whether additional elements such as the first semiconductor device, the vertical connecting elements and the encapsulant are between the first routing circuitry and the second routing circuitry.

The phrases "mounted on" and "attached on" include contact and non-contact with a single or multiple element(s). For instance, the optional heat spreader can be attached on the second semiconductor device regardless of whether it contacts the second semiconductor device or is separated from the second semiconductor device by a thermally conductive adhesive or solder balls.

The phrase "aligned with" refers to relative position between elements regardless of whether elements are spaced from or adjacent to one another or one element is inserted into and extends into the other element. For instance, the interior sidewall surface of the stiffener is laterally aligned with the peripheral edges of the electronic component since an imaginary horizontal line intersects the interior sidewall surface of the stiffener and the peripheral edges of the electronic component, regardless of whether another element is between the interior sidewall surface of the stiffener and the peripheral edges of the electronic component and is intersected by the line, and regardless of whether another imaginary horizontal line intersects the peripheral edges of the electronic component but not the interior sidewall surface of the stiffener or intersects the interior sidewall surface of the stiffener but not the peripheral edges of the electronic component.

The phrase "in close proximity to" refers to a gap between elements not being wider than the maximum acceptable limit. As known in the art, when the gap between the interior sidewall surface of the stiffener and the electronic component/sacrificial carrier is not narrow enough, the location error of the electronic component/sacrificial carrier due to the lateral displacement of the electronic component/sacrificial carrier within the gap may exceed the maximum acceptable error limit. In some cases, once the location error of the electronic component/sacrificial carrier goes beyond the maximum limit, it is impossible to align the predetermined portion of the vertical connecting elements with a laser beam, resulting in the electrical connection failure between the vertical connecting elements and the second routing circuitry. Those skilled in the art can ascertain the maximum acceptable limit for a gap between the electronic component/sacrificial carrier and the stiffener through trial and error to ensure the metallized vias being of the second routing circuitry aligned with the vertical connecting elements of the electronic component. Thereby, the description "peripheral edges of the electronic component and the sacrificial carrier are in close proximity to the interior sidewall surface of the through opening of the stiffener" means that the gap between the peripheral edges of the sacrificial carrier and the interior sidewall surface of the through opening and between the peripheral edges of the electronic component and the interior sidewall surface of the through opening is narrow enough to prevent the location error of the electronic component/sacrificial carrier from exceeding the maximum acceptable error limit. For instance, the gaps in between the peripheral edges of the electronic component/sacrificial carrier and the interior sidewall surface of the through opening preferably may be in a range of about 10 to 50 microns.

The phrases "electrical connection", "electrically connected" and "electrically coupled" refer to direct and indirect electrical connection. For instance, the first conductive traces directly contact and are electrically connected to the routing traces and the second conductive traces are spaced from and electrically connected to the routing traces by the first conductive traces.

The "first direction" and "second direction" do not depend on the orientation of the wiring board, as will be readily apparent to those skilled in the art. For instance, the first surface of the encapsulant faces the first direction and the second surface of the encapsulant faces the second direction regardless of whether the wiring board is inverted. Thus, the first and second directions are opposite one another and orthogonal to the lateral directions. Furthermore, the first direction is the upward direction and the second direction is the downward direction in the cavity-up position, and the first direction is the downward direction and the second direction is the upward direction in the cavity-down position.

The wiring board according to the present invention has numerous advantages. For instance, the first semiconductor device is electrically coupled to the first routing circuitry by a well-known flip chip bonding process such as thermo-compression or solder reflow, which can avoid the positional accuracy issue inherent in most stackable approaches where an adhesive carrier is used for temporary bonding. The first routing circuitry within the through opening of the stiffener provides a first level fan-out routing/interconnection for a second semiconductor device to be assembled thereon, whereas the second routing circuitry on the encapsulant and the stiffener provides a second level fan-out routing/interconnection. As such, the second semiconductor device with fine pads can be electrically coupled to one side of the first routing circuitry with pad pitch that matches the second semiconductor device, and the second routing circuitry is electrically connected to the other side of the first routing circuitry with larger pad pitch through the vertical connecting elements and further enlarges the pad size and pitch of the second semiconductor device. The stiffener can provide an anti-warping platform for the second routing circuitry formation thereon to suppress warping and bending of the wiring board. The wiring board made by this method is reliable, inexpensive and well-suited for high volume manufacture.

The manufacturing process is highly versatile and permits a wide variety of mature electrical and mechanical connection technologies to be used in a unique and improved manner. The manufacturing process can also be performed without expensive tooling. As a result, the manufacturing process significantly enhances throughput, yield, performance and cost effectiveness compared to conventional techniques.

The embodiments described herein are exemplary and may simplify or omit elements or steps well-known to those skilled in the art to prevent obscuring the present invention. Likewise, the drawings may omit duplicative or unnecessary elements and reference labels to improve clarity.

What is claimed is:

1. A face-to-face semiconductor assembly, comprising: a wiring board with embedded component and integrated stiffener, comprising: a stiffener having a through opening, wherein the through opening has an interior sidewall surface that extends through the stiffener; an electronic component that is positioned within the through opening of the stiffener and adjacent to the interior sidewall surface of the stiffener and includes a first semiconductor device, an encapsulant, an array of vertical connecting elements and a first routing circuitry disposed on a first surface of the encapsulant, wherein (i) the first semiconductor device is embedded in the encapsulant and electrically coupled to the first routing circuitry and (ii) the vertical connecting elements are laterally covered by the encapsulant and surround the first semiconductor device, wherein the vertical connecting elements are electrically coupled to the first routing circuitry and extend to a second surface of the encapsulant opposite to the first surface; and a second routing circuitry that is disposed over and in direct contact with the second surface of the encapsulant and laterally extending over and in direct contact with a surface of the stiffener, wherein the second routing circuitry is a buildup routing circuitry having metallized vias electrically coupled to and in direct contact with the vertical connecting elements in the encapsulant, and a second semiconductor device disposed in the through opening of the stiffener and face-to-face electrically coupled to the first semiconductor device through the first routing circuitry between the first semiconductor device and the second semiconductor device.

2. The face-to-face semiconductor assembly of claim 1, wherein the vertical connecting elements include metal pillars, solder balls, conductive vias or a combination thereof.

3. The face-to-face semiconductor assembly of claim 1, further comprising additional vertical connecting elements in the stiffener, wherein the additional vertical connecting elements are electrically coupled to the second routing circuitry.

4. The face-to-face semiconductor assembly of claim 3, wherein the additional vertical connecting elements include metal pillars, solder balls, conductive vias or a combination thereof.

5. The face-to-face semiconductor assembly of claim 1, wherein the first routing circuitry has an exposed surface facing away from the first surface of the encapsulant and exposed from the through opening of the stiffener.

6. The face-to-face semiconductor assembly wiring board of claim 5, wherein a portion of the interior sidewall surface of the stiffener and the exposed surface of the first routing circuitry form a cavity in the through opening of the stiffener.

7. The face-to-face semiconductor assembly of claim 3, further comprising a heat spreader that is attached to an inactive surface of the second semiconductor device and electrically coupled to the additional vertical connecting elements in the stiffener.

8. A method of making a face-to-face semiconductor assembly, comprising:
   providing an electronic component over a sacrificial carrier, the electronic component including a first semiconductor device, an encapsulant, an array of vertical connecting elements and a first routing circuitry disposed on a first surface of the encapsulant, wherein (i) the first routing circuitry is detachably adhered over the sacrificial carrier, (ii) the first semiconductor device is embedded in the encapsulant and electrically coupled to the first routing circuitry, and (iii) the vertical connecting elements are laterally covered by the encapsulant and extend to a second surface of the encapsulant opposite to the first surface, surround the first semiconductor device and are electrically coupled to the first routing circuitry;
   providing a stiffener that has a through opening, wherein the through opening has an interior sidewall surface that extends through the stiffener; inserting the electronic component and the sacrificial carrier into the through opening of the stiffener, with the electronic component and the sacrificial carrier being adjacent to the interior sidewall surface of the stiffener;
   forming a second routing circuitry that is disposed over and in direct contact with a second surface of the encapsulant opposite to the first surface and laterally extending over and in direct contact with a surface of the stiffener, wherein the second routing circuitry is a buildup circuitry having metallized vias electrically coupled to and in direct contact with the vertical connecting elements in the encapsulant;
   removing the sacrificial carrier from the first routing circuitry; and
   disposing a second semiconductor device in the through opening of the stiffener and face-to-face electrically coupled to the first semiconductor device through the first routing circuitry between the first semiconductor device and the second semiconductor device.

9. The method of claim 8, wherein the step of providing the electronic component over the sacrificial carrier includes: providing the first routing circuitry detachably adhered over the sacrificial carrier; electrically coupling the first semiconductor device to the first routing circuitry; forming the vertical connecting elements; and providing the encapsulant that laterally surrounds the first semiconductor device and covers the first routing circuitry.

10. The method of claim 8, wherein the step of forming the second routing circuitry includes electrically coupling the second routing circuitry to additional vertical connecting elements in the stiffener.

11. A face-to-face semiconductor assembly, comprising:
   a wiring board comprising:
      a stiffener having a through opening, wherein the through opening has an interior sidewall surface that extends through the stiffener;
      an electronic component that is positioned within the through opening of the stiffener and adjacent to the interior sidewall surface of the stiffener and includes a first semiconductor device, and encapsulant, an array of vertical connecting elements and first routing circuitry disposed on a first surface of the encapsulant, wherein (i) the first semiconductor device is embedded in the encapsulant and electrically coupled to the first routing circuitry and (ii) the vertical connecting elements are laterally covered by the encapsulant and surround the first semiconductor device, wherein the vertical connecting elements are electrically coupled to the first routing circuitry and extend to a second surface of the encapsulant opposite to the first surface;
      a second routing circuitry that is disposed over the second surface of the encapsulant and laterally extending over a surface of the stiffener, wherein the second routing circuitry is electrically coupled to the vertical connecting elements in the encapsulant; and
      additional vertical connecting elements in the stiffener, wherein the additional vertical connecting elements are electrically coupled to the second routing circuitry;
   a second semiconductor device disposed in the through opening of the stiffener and face-to-face electrically coupled to the first semiconductor device through the first routing circuitry between the first semiconductor device and the second semiconductor device; and
   a heat spreader that is attached to an inactive surface of the second semiconductor device and electrically coupled to the additional vertical connecting elements in the stiffener.

12. The face-to-face semiconductor assembly of claim 11, wherein the vertical connecting elements of the electronic component positioned within the through opening of the stiffener include metal pillars, solder balls, conductive vias, or a combination thereof.

13. The face-to-face semiconductor assembly of claim 11, wherein the additional vertical connecting elements in the stiffener include metal pillars, solder balls, conductive vias, or a combination thereof.

* * * * *